(12) United States Patent
Aleksov et al.

(10) Patent No.: US 11,430,751 B2
(45) Date of Patent: Aug. 30, 2022

(54) MICROELECTRONIC DEVICES DESIGNED WITH 3D STACKED ULTRA THIN PACKAGE MODULES FOR HIGH FREQUENCY COMMUNICATIONS

(71) Applicant: Intel Corporation, Santa Clara, CA (US)

(72) Inventors: Aleksandar Aleksov, Chandler, AZ (US); Georgios C. Dogiamis, Chandler, AZ (US); Telesphor Kamgaing, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/465,132

(22) PCT Filed: Dec. 30, 2016

(86) PCT No.: PCT/US2016/069623
§ 371 (c)(1),
(2) Date: May 29, 2019

(87) PCT Pub. No.: WO2018/125242
PCT Pub. Date: Jul. 5, 2018

(65) Prior Publication Data
US 2020/0066663 A1 Feb. 27, 2020

(51) Int. Cl.
*H01L 23/66* (2006.01)
*H01L 23/31* (2006.01)
(Continued)

(52) U.S. Cl.
CPC .......... *H01L 23/66* (2013.01); *H01L 23/3121* (2013.01); *H01L 23/5389* (2013.01);
(Continued)

(58) Field of Classification Search
CPC . H01L 23/66; H01L 23/3121; H01L 23/5389; H01L 23/552; H01L 25/16;
(Continued)

(56) References Cited

U.S. PATENT DOCUMENTS

2003/0141590 A1* 7/2003 Kamiya ........... G06K 19/07728
257/730
2008/0111226 A1 5/2008 White et al.
(Continued)

OTHER PUBLICATIONS

International Search Report and Written Opinion for International Patent Application No. PCT/US2016/069623 dated Sep. 28, 2017, 12 pgs.
(Continued)

*Primary Examiner* — Su C Kim
(74) *Attorney, Agent, or Firm* — Schwabe, Williamson & Wyatt P.C.

(57) ABSTRACT

Embodiments of the invention include a microelectronic device that includes a first ultra thin substrate formed of organic dielectric material and conductive layers, a first mold material to integrate first radio frequency (RF) components with the first substrate, and a second ultra thin substrate being coupled to the first ultra thin substrate. The second ultra thin substrate formed of organic dielectric material and conductive layers. A second mold material integrates second radio frequency (RF) components with the second substrate.

23 Claims, 17 Drawing Sheets

(51) Int. Cl.
*H01L 23/538* (2006.01)
*H01L 23/552* (2006.01)
*H01L 25/16* (2006.01)
*H01Q 1/22* (2006.01)
*H01Q 1/24* (2006.01)
*H01Q 1/52* (2006.01)

(52) U.S. Cl.
CPC ............ *H01L 23/552* (2013.01); *H01L 25/16* (2013.01); *H01Q 1/2283* (2013.01); *H01Q 1/241* (2013.01); *H01Q 1/526* (2013.01); H01L 2223/6672 (2013.01); H01L 2223/6677 (2013.01)

(58) Field of Classification Search
CPC ..... H01L 2223/6672; H01L 2223/6677; H01L 25/105; H01L 23/49816; H01L 24/16; H01L 2224/16227; H01L 2224/81005; H01L 23/48; H01L 23/3677; H01L 2221/68345; H01L 2221/68359; H01L 2224/73204; H01L 2225/1023; H01L 2225/1041; H01L 2225/1058; H01L 2924/15192; H01L 2924/18161; H01L 21/6835; H01L 23/00; H01L 23/3128; H01L 23/49811; H01L 23/49838; H01L 24/19; H01L 24/25; H01L 25/0652; H01L 25/0655; H01Q 1/2283; H01Q 1/241; H01Q 1/526
See application file for complete search history.

(56) References Cited

U.S. PATENT DOCUMENTS

| | | | | |
|---|---|---|---|---|
| 2012/0061474 | A1* | 3/2012 | Lien | .................. H01L 23/49866 235/492 |
| 2012/0104574 | A1* | 5/2012 | Boeck | ..................... H01L 24/20 257/660 |
| 2013/0234304 | A1* | 9/2013 | Tamaki | ................... H01L 23/66 257/659 |
| 2014/0035892 | A1* | 2/2014 | Shenoy | ............. H01L 23/49827 345/205 |
| 2014/0185264 | A1 | 7/2014 | Chen et al. | |
| 2015/0001689 | A1 | 1/2015 | Goetz et al. | |
| 2015/0155203 | A1* | 6/2015 | Chen | ....................... H01L 24/83 438/107 |
| 2016/0300797 | A1 | 10/2016 | Shim et al. | |
| 2016/0329299 | A1 | 11/2016 | Lin et al. | |
| 2016/0336638 | A1 | 11/2016 | Dang et al. | |

OTHER PUBLICATIONS

International Preliminary Report on Patentability for International Patent Application No. PCT/US2016/069623, dated Jul. 11, 2019, 19 pgs.
Office Action from Taiwan Patent Application No. 106141376, dated Feb. 25, 2021, 11 pgs.
Office Action from Taiwan Patent Application No. 106141376, dated Oct. 14, 2021, 5 pgs.
Notice of Allowance from Taiwan Patent Application No. 106141376, dated Jun. 14, 2022, 3 pgs.
Office Action from Taiwan Patent Application No. 106141376, dated Mar. 31, 2022, 3 pgs.

\* cited by examiner

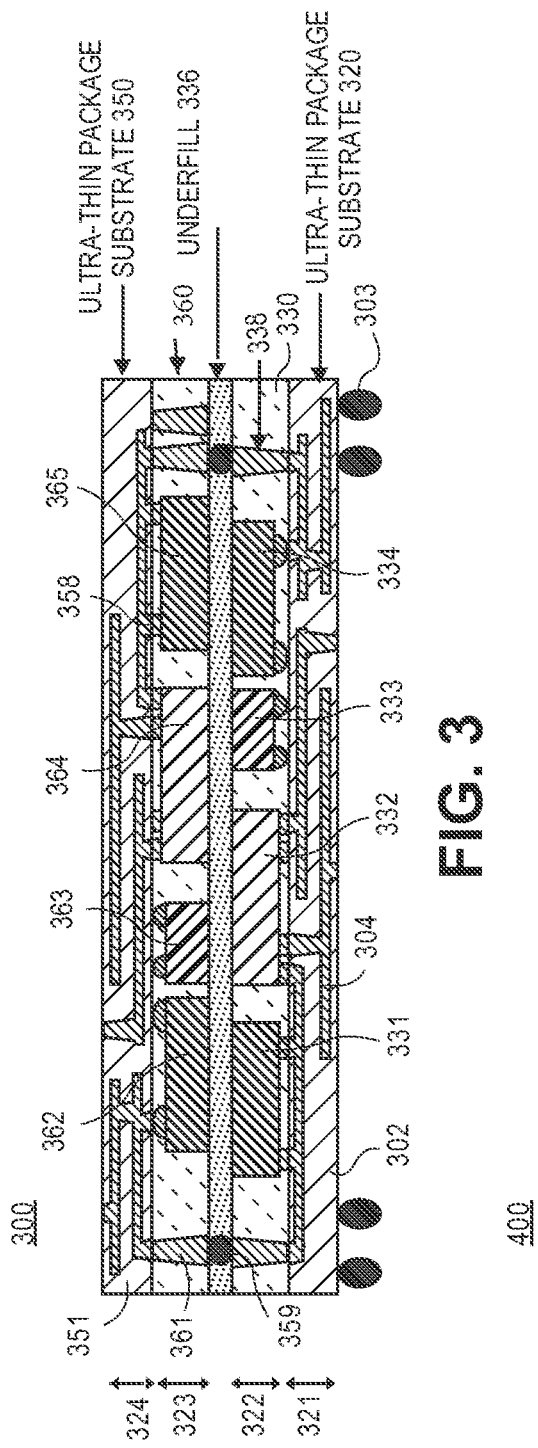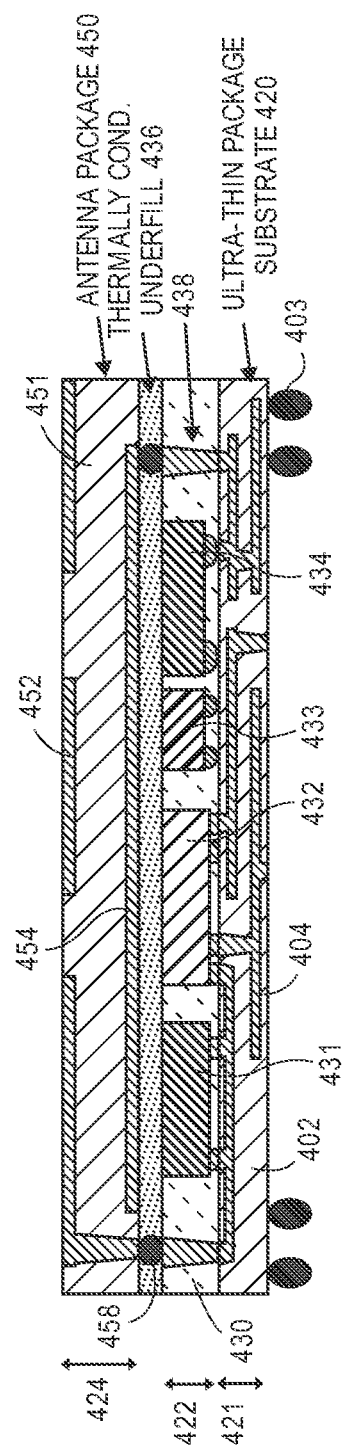
FIG. 3
FIG. 4A

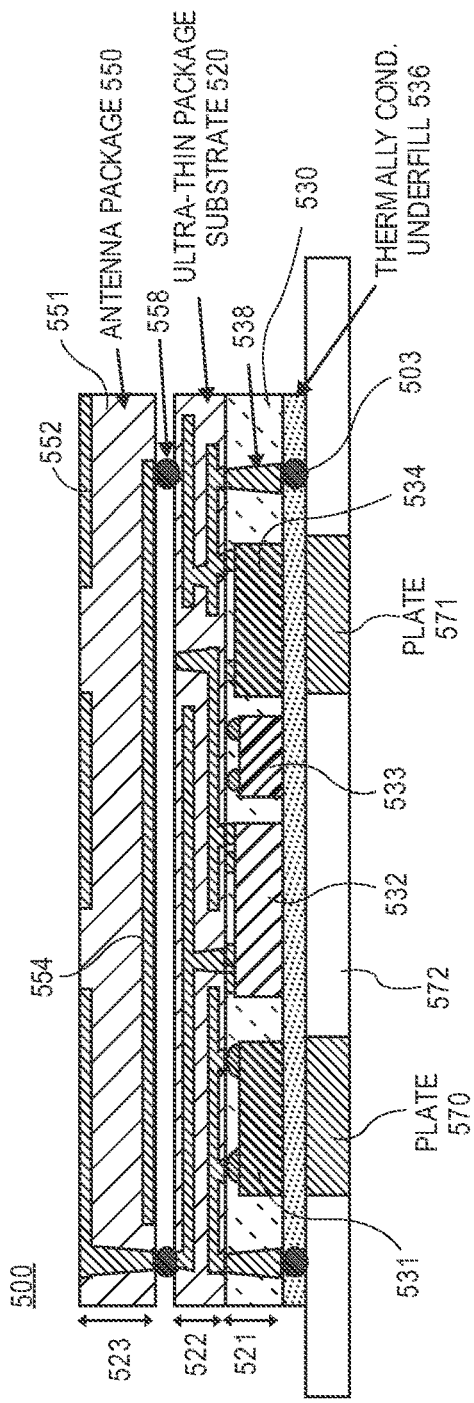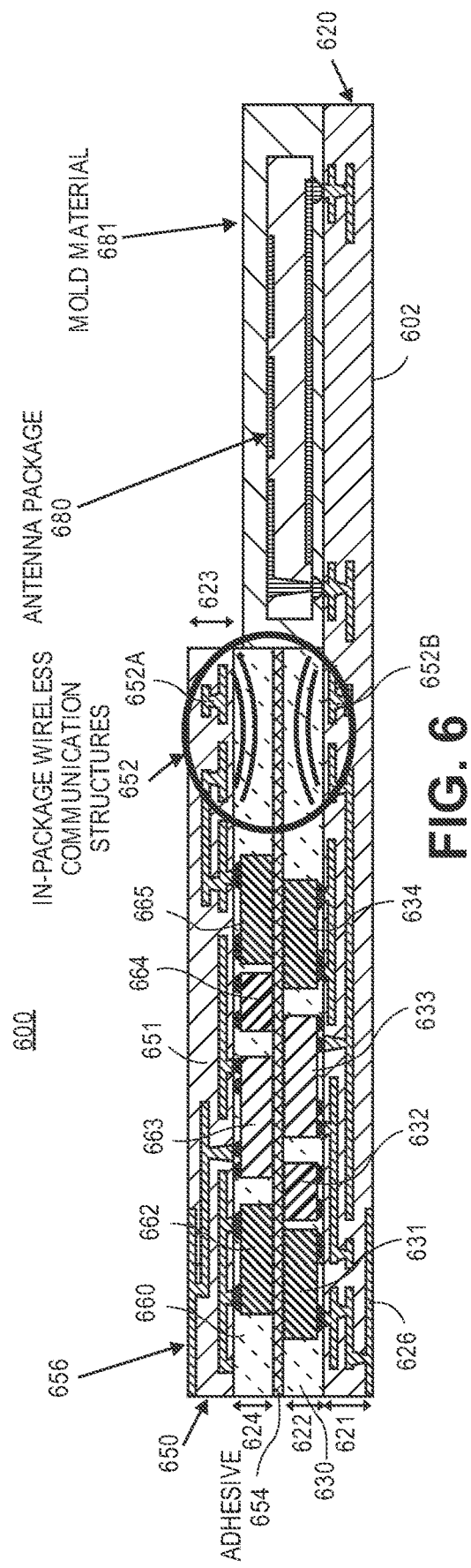

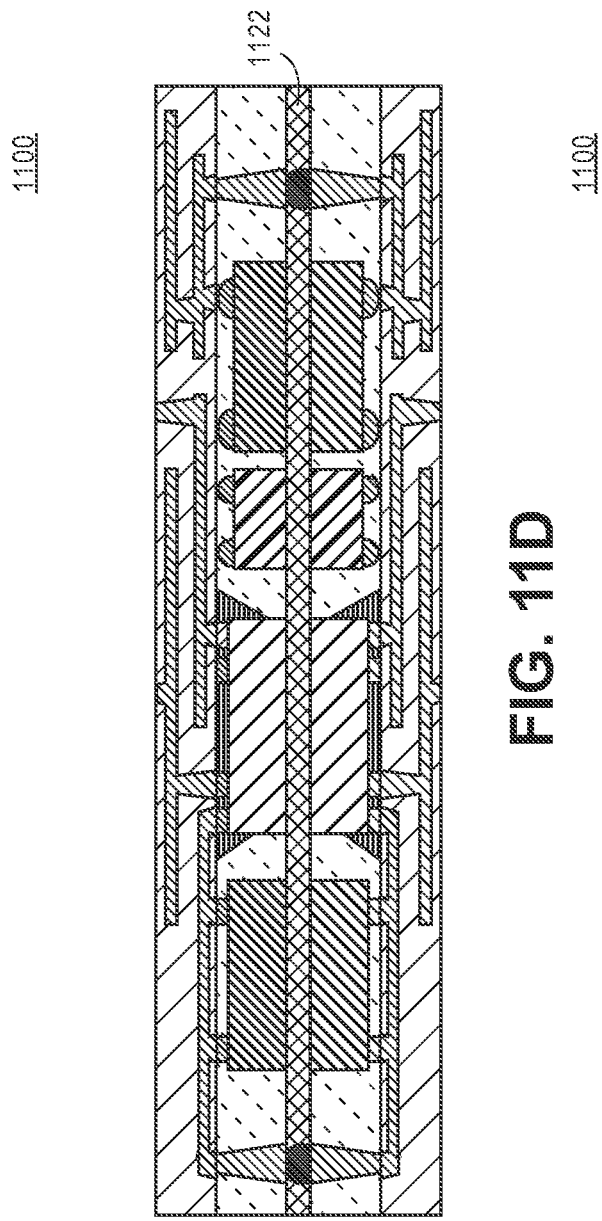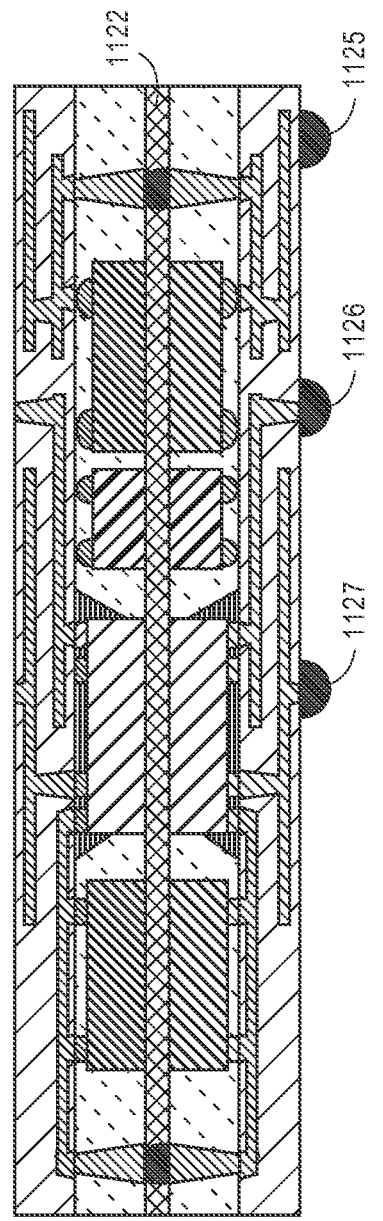
FIG. 11D
FIG. 11E

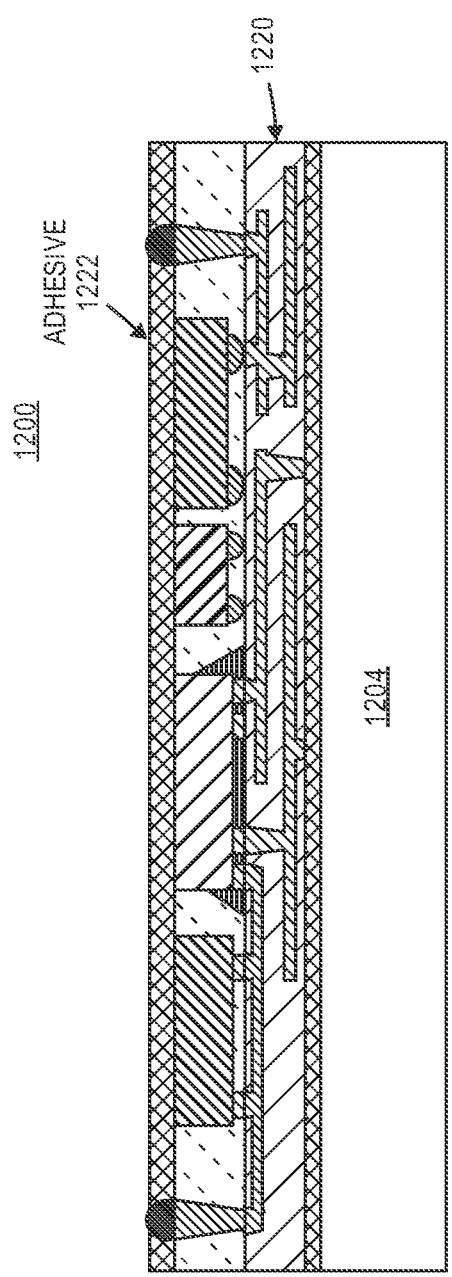
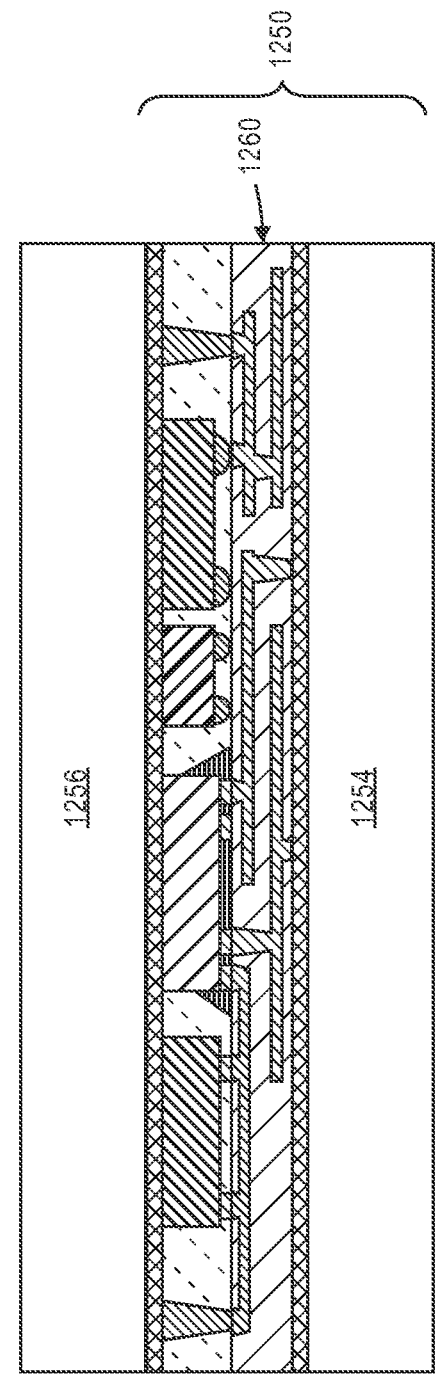
FIG. 12A
FIG. 12B

US 11,430,751 B2

MICROELECTRONIC DEVICES DESIGNED WITH 3D STACKED ULTRA THIN PACKAGE MODULES FOR HIGH FREQUENCY COMMUNICATIONS

CROSS-REFERENCE TO RELATED APPLICATION

This patent application is a U.S. National Phase Application under 35 U.S.C. § 371 of International Application No. PCT/US2016/069623, filed Dec. 30, 2016, entitled "MICROELECTRONIC DEVICES DESIGNED WITH 3D STACKED ULTRA THIN PACKAGE MODULES FOR HIGH FREQUENCY COMMUNICATIONS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices designed with 3D stacked ultra thin package modules for high frequency communications (e.g., 5G communications).

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz (e.g., millimeter wave frequencies (e.g., 30 GHz-300 GHz). Moreover, the current WiGig (Wireless Gigabit Alliance) products operate around 60 GHz (e.g. 57-66 GHz worldwide).

The next generation wireless and mobile communication system is expected to unify different communication standards ranging from MHz to millimeter wave frequencies. The different types of applications require very small form factors that can fit in almost any device. At the package level, both the die and the interconnect structure must have very thin Z-height. Such form factors have been traditionally realized using wafer level packaging.

BRIEF DESCRIPTION OF THE DRAWINGS

FIG. 3 illustrates co-integrating different components in a microelectronic device (e.g., an inter die fabric architecture) utilizing ultra-thin package substrates in accordance with one embodiment.

FIG. 4A illustrates co-integrating different components in a microelectronic device (e.g., an inter die fabric architecture) utilizing ultra-thin package substrates in accordance with one embodiment.

FIG. 5A illustrates co-integrating different components in a microelectronic device (e.g., an inter die fabric architecture) utilizing ultra-thin package substrates in accordance with one embodiment.

FIG. 6 illustrates co-integrating different components in a microelectronic device (e.g., an inter die fabric architecture) utilizing ultra-thin package substrates in accordance with one embodiment.

FIGS. 11A-11E illustrate front to front or top to top module 3D connectivity in accordance with one embodiment.

FIGS. 12A-12E illustrate top to back module 3D connectivity in accordance with one embodiment.

DETAILED DESCRIPTION OF THE INVENTION

Figure 1:
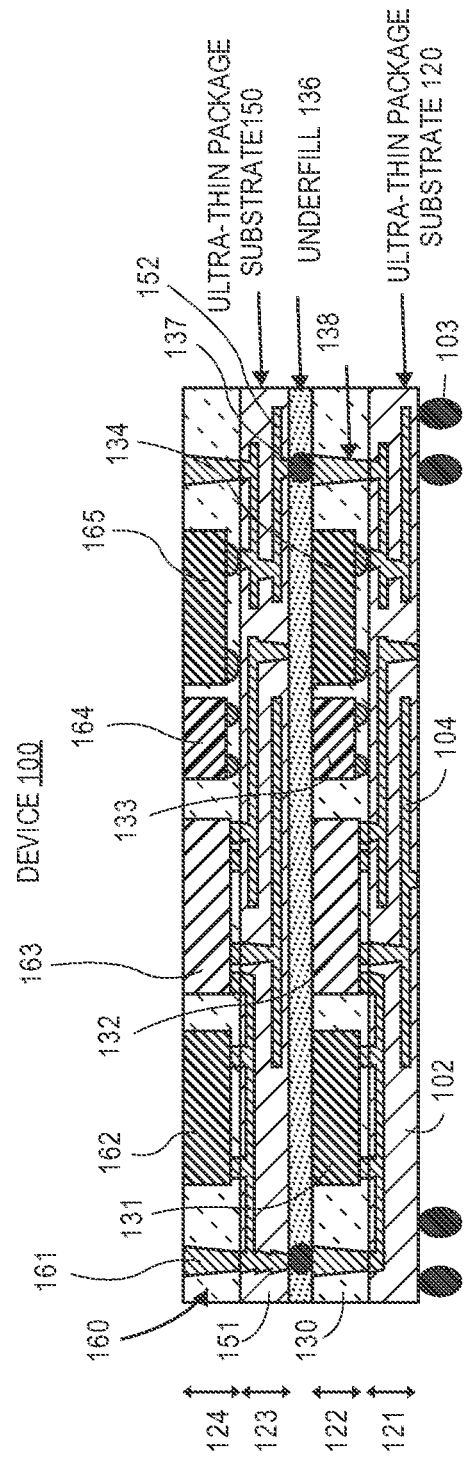
FIG. 1 illustrates co-integrating different components in a microelectronic device (e.g., an inter die fabric architecture) utilizing ultra-thin package substrates in accordance with one embodiment.

Described herein are microelectronic devices designed with 3D stacked ultra thin package modules for high frequency communications (e.g., 5G communications). In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

The present design provides 3D stacking of modules for 5G applications by using ultra-thin packages with molded dies. The present design utilizes emerging ultra-thin substrate (e.g., 50 to 250 microns) and assembly to ultra-thin substrate technologies in conjunction with integrated passive devices (IPDs) and other circuit elements such as package integrated antennae to enable form-factors for 5G applications with significantly reduced thickness yet full 5G capability and high computational density required for such radios and systems. This leads to 5G systems that can easily be integrated or added to existing systems thus providing any desired 5G functionality. Moreover some embodiments also allow for easy interchangeability since no soldering to any host board is required and thus system adaptability beyond what current systems can achieve.

For high frequency (e.g., 5G, WiGig) wireless applications of millimeter (e.g., 1-10 mm, any mm wave or higher) wave communication systems, the designed RF circuits (e.g., low-noise amplifiers, mixers, power amplifiers, switches, etc.) are in need of high quality passive matching networks, in order to accommodate the transmission of pre-defined frequency bands where the communication takes place as well as in need of high efficiency power amplifiers, and low loss, power combiners/switches, etc. CMOS technology for greater than 15 GHz operation can be utilized, but with decreased power amplifier efficiencies and with low quality factor passives, mainly due to the typically lossy silicon substrate employed. This results not only in a lower system performance, but also in increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design includes high frequency components (e.g., 5G transceiver) and utilizes non-CMOS technologies (e.g., non-silicon substrates) for critical parts of a communication system (e.g., GaAs, GaN, Passives-on-Glass, etc.). Critical parts requiring high efficiencies and high quality factors can be fabricated on another technology (e.g., compound semiconductor materials, group III-V materials). These parts might be either on device level (e.g., transistors on GaN/GaAs) or on circuit level (e.g., III-V die integrating a power amplifier, a low noise amplifier, etc.) and integrated with silicon based substrates. The full communication system will be formed in a package-fabric manner, as discussed in embodiments of this invention.

The present design technology allows co-integrating dies and/or devices that are fabricated on different technologies and/or substrates on the same package for performance enhancement and relaxation of thermal requirements. The package might include antenna units for communication with other wireless systems.

In one embodiment, the present design is a 5G (5$^{th}$ generation mobile networks or 5$^{th}$ generation wireless systems) architecture having non-CMOS based transceiver building blocks (e.g., group III-V based devices or dies, GaN islands) that are co-integrated on the same package with low frequency circuits and integrated passive devices (IPDs) for performance enhancement and thermal requirements relaxation. In this arrangement, each component is integrated assembled directly on the package. The package may have antennas directly integrated onto it. The 5G architecture operates at a high frequency (e.g., at least 20 GHz, at least 25 GHz, at least 28 GHz, at least 30 GHz, etc.) and may also have approximately 1-50 gigabits per second (Gbps) connections to end points. In another example, the present design operates at lower frequencies (e.g., at least 4 GHz, approximately 4 GHz).

FIG. 1 illustrates co-integrating different components in a microelectronic device (e.g., an inter die fabric architecture) utilizing ultra-thin package substrates in accordance with one embodiment. The microelectronic device 100 (e.g., an inter die fabric architecture 100) includes ultra thin package substrates 120 and 150 (e.g., copper based interconnects in low temperature co-fired ceramic materials, liquid crystal polymers, organic materials including ceramic/alumina/glass filled epoxides, glass, undoped silicon, etc.) arranged with a top side up three dimensional (3D) stack of two communication systems (e.g., 5G communication systems). The substrates 120 and 150 can have ultra thin thicknesses 121 and 123, respectively (e.g., thickness of 50 to 80 microns, 60 to 70 microns, etc.). An optional substrate (e.g., silicon substrate, printed circuit board, etc.) may be coupled to substrate 120 via secondary level interconnect 103 (e.g., solder balls 103). The substrate 120 includes organic dielectric material 102 and conductive layers 104 that are coupled to components 131-134 (e.g., compound semiconductor dies 131, 134, CMOS die 132, IPD 133). The overmold material 130 (e.g., organic mold compound materials including an epoxide matrix with ceramic/silica fillers, elastomer materials, or non-filled epoxides, etc.) at least partially encapsulates these components that are integrated by or onto the substrate 120. The overmold material 130 may surround these components completely (e.g., all sides, top, bottom) or may only partially surround (e.g., not above) these components. The overmold material 130 may include through mold connections 138 for routing electrical signals through the overmold material 130.

The compound semiconductor components 131 and 134 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 120 (or embedded within cavities of the substrate) at the beginning, during, or at the end of the processing for the substrate 120. Integrated passive device or die (IPD) 133 is coupled to the substrate 120 with connections (e.g., bumps, Cu pillars with solder cap on top, etc.). IPDs are assembled to the substrate 120 to enable RF front-end functionality as well as digital and analog functionalities. The IPDs may include any type of passives including inductors, transformers, capacitors, and resistors. In one example, capacitors on the IPD die may be used for power delivery. In another example, resistors on the same or a different IPD may be used for power combining or splitting. The components of the substrate 120 can communicate with components of the substrate 150 or other components not shown in FIG. 1 using secondary level interconnect 103 (e.g., solder balls).

The substrate 150 includes organic dielectric material 151 and conductive layers 152 that are coupled to components 162-165 (e.g., compound semiconductor dies 162, 165, CMOS die 163, IPD 164). The overmold material 160 (e.g., organic mold compound materials including an epoxide matrix with ceramic/silica fillers, elastomer materials, or non-filled epoxides, etc.) at least partially encapsulates these components that are integrated by or onto the substrate 150. The overmold material 160 may surround these components completely (e.g., all sides, top, bottom) or may only partially surround (e.g., not above) these components. The overmold material 160 may include through mold connections 161 for routing electrical signals through the overmold material 160. The overmold materials 130 and 160 can have thin thicknesses 122 and 124, respectively (e.g., thickness of 50 to 150 microns, 80 to 120 microns, etc.).

The compound semiconductor components 162 and 165 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 150 (or embedded within cavities of the substrate) at the beginning, during, or at the end of the processing for the substrate 150. Integrated passive device or die (IPD) 164 is coupled to the substrate 150 with connections (e.g., bumps, Cu pillars with solder cap on top, etc.). IPDs are assembled to the substrate 150 to enable RF front-end functionality as well as digital and analog functionalities.

An underfill 136 (e.g., non-thermally conductive underfill, thermally conductive underfill) allows the substrate 120 to be attached to the substrate 150. In one example, the underfill 136 is applied to an upper surface of overmold material 130 and then a lower surface of the substrate 150 is applied to the underfill 136. Interconnect 137 (e.g., solder balls) and through mold connections electrically couple conductive layers of the substrates 120 and 150.

The substrates and overmold materials of FIG. 1 can have different thicknesses, lengths, and widths dimensions. In one example, the substrates 120 and 150 and overmold materials 130 and 160 have a total thickness of 200 to 400 microns for an ultra thin form factor in an ultra thin electronic device.

In one example, components of the substrates 120 and 150 which primarily dominate a packaging area are partitioned in a separate lower cost and lower circuit density substrate in comparison to package substrate technology, and may utilize high density interconnect PCB technology (HDI PCB) and impedance controlled interconnect. HDI PCB technologies may include blind and/or buried via processes and possibly microvias with a higher circuit density than traditional PCBs (but lower density than package substrate technologies). The optional substrate may be formed with any materials that are designed for high frequency designs having desirable high frequency characteristics (e.g., substrate loss, dielectric constant).

In another embodiment, any of the devices or components can be coupled to each other.

Figure 2:
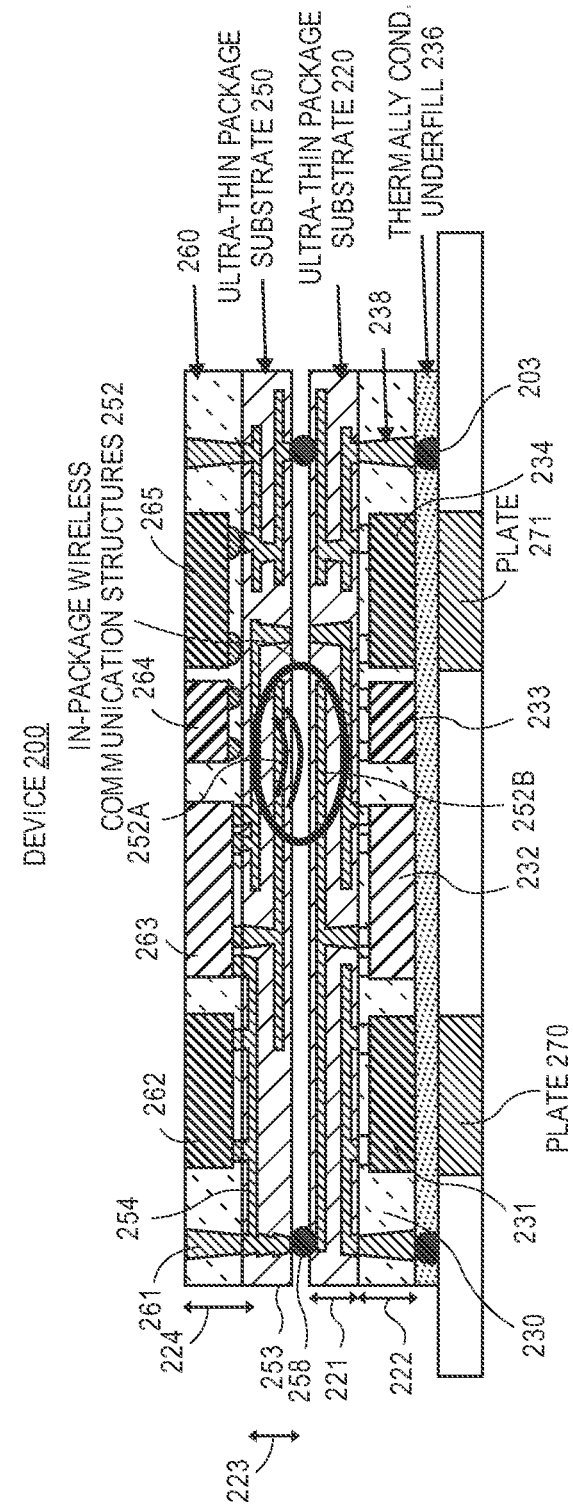
FIG. 2 illustrates co-integrating different components in a microelectronic device (e.g., an inter die fabric architecture) utilizing ultra-thin package substrates in accordance with one embodiment.

FIG. 2 illustrates co-integrating different components in a microelectronic device (e.g., an inter die fabric architecture) utilizing ultra-thin package substrates in accordance with one embodiment. The microelectronic device 200 (e.g., an inter die fabric architecture) includes ultra thin package substrates 220 and 250 (e.g., copper based interconnects in low temperature co-fired ceramic materials, liquid crystal polymers, organic materials including ceramic/alumina/glass filled epoxides, glass, undoped silicon, etc.) arranged with a bottom to bottom three dimensional (3D) stack of two communication systems (e.g., 5G communication systems). The substrates 220 and 250 can have ultra thin thicknesses 221 and 223, respectively (e.g., thickness of 50 to 80 microns, 60 to 70 microns, etc.). Conductive layers 270-271 (e.g., pads 270-271) may be coupled to substrate 220 via secondary level interconnect 203 (e.g., solder balls 203) and with thermally conductive underfill 236. In one example, the thermally conductive underfill 236 thermally couples adjacent elements. The pads allow for connectivity to a board via slot or socket. The pads may be utilized as thermal slugs for thermal management. The substrate 220 includes organic dielectric material and conductive layers that are coupled to components 231-234 (e.g., compound semiconductor dies 231, 234, CMOS die 232, IPD 233). The overmold material 230 (e.g., organic mold compound materials including an epoxide matrix with ceramic/silica fillers, elastomer materials, or non-filled epoxides, etc.) at least partially encapsulates these components that are integrated by or onto the substrate 220. The overmold material 230 may surround these components completely (e.g., all sides, top, bottom) or may only partially surround (e.g., not above) these components. The overmold material 230 may include through mold connections 238 for routing electrical signals through the overmold material 230.

The compound semiconductor components 231 and 234 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 220 (or embedded within cavities of the substrate) at the beginning, during, or at the end of the processing for the substrate 220. Integrated passive device or die (IPD) 233 is coupled to the substrate 220 with connections (e.g., bumps, Cu pillars with solder cap on top, etc.). IPDs are assembled to the substrate 220 to enable RF front-end functionality as well as digital and analog functionalities.

The substrate 250 includes organic dielectric material 251 and conductive layers 252 that are coupled to components 262-265 (e.g., compound semiconductor dies 262, 265, CMOS die 263, IPD 264). The overmold material 260 (e.g., organic mold compound materials including an epoxide matrix with ceramic/silica fillers, elastomer materials, or non-filled epoxides, etc.) at least partially encapsulates these components that are integrated by or onto the substrate 250 The overmold material 260 may surround these components completely (e.g., all sides, top, bottom) or may only partially surround (e.g., not above) these components. The overmold material 260 may include through mold connections 261 for routing electrical signals through the overmold material 230. The overmold materials 230 and 260 can have thin thicknesses 222 and 224, respectively (e.g., thickness of 50 to 150 microns, 80 to 120 microns, etc.).

The compound semiconductor components 262 and 265 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 250 (or embedded within cavities of the substrate) at the beginning, during, or at the end of the processing for the substrate 250. Integrated passive device or die (IPD) 264 is coupled to the substrate 250 with connections (e.g., bumps, Cu pillars with solder cap on top, etc.). IPDs are assembled to the substrate 250 to enable RF front-end functionality as well as digital and analog functionalities.

Interconnect 258 (e.g., solder balls) electrically couple conductive layers of the substrates 220 and 250. In one example, thermally conductive underfill may be present between substrates 220 and 250. Additionally the substrates 220 and 250 include in-package wireless communication structures 252 for wireless communications between substrates 220 and 250. Substrate 220 includes a communication structure 252b and substrate 250 includes a communication structure 252a.

The substrates and overmold materials of FIG. 2 can have different thicknesses, lengths, and widths dimensions. In one example, the substrates 220 and 250 and overmold materials 230 and 260 have a total thickness of 200 to 400 microns for an ultra thin form factor in an ultra thin electronic device.

FIG. 3 illustrates co-integrating different components in a microelectronic device (e.g., an inter die fabric architecture)

utilizing ultra-thin package substrates in accordance with one embodiment. The microelectronic device 300 (e.g., an inter die fabric architecture 300) includes ultra thin package substrates 320 and 350 (e.g., copper based interconnects in low temperature co-fired ceramic materials, liquid crystal polymers, organic materials including ceramic/alumina/glass filled epoxides, glass, undoped silicon, etc.) a arranged with a face to face three dimensional (3D) stack of two communication systems (e.g., 5G communication systems). The substrates 320 and 350 can have ultra thin thicknesses 321 and 324, respectively (e.g., thickness of 50 to 80 microns, 60 to 70 microns, etc.). An optional substrate (e.g., printed circuit board, etc.) having conductive layers may be coupled to substrate 320 via secondary level interconnect 303 (e.g., solder balls 303). The substrate 320 includes organic dielectric material and conductive layers that are coupled to components 331-334 (e.g., compound semiconductor dies 331, 334, CMOS die 332, IPD 333). The overmold material 330 (e.g., organic mold compound materials including an epoxide matrix with ceramic/silica fillers, elastomer materials, or non-filled epoxides, etc.) at least partially encapsulates these components that are integrated by or onto the substrate 320. The overmold material 330 may surround these components completely (e.g., all sides, top, bottom) or may only partially surround (e.g., not above) these components. The overmold material 330 may include through mold connections 338 for routing electrical signals through the overmold material 330.

The compound semiconductor components 331 and 334 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 320 (or embedded within cavities of the substrate) at the beginning, during, or at the end of the processing for the substrate 320. Integrated passive device or die (IPD) 333 is coupled to the substrate 320 with connections (e.g., bumps, Cu pillars with solder cap on top, etc.). IPDs are assembled to the substrate 320 to enable RF front-end functionality as well as digital and analog functionalities.

The substrate 350 includes organic dielectric material 351 and conductive layers 358 that are coupled to components 362-365 (e.g., compound semiconductor dies 362, 365, CMOS die 363, IPD 364). The overmold material 360 (e.g., glass, high resistivity silicon, organic substrate, ceramic substrate, alumina substrate, compound semiconductor substrate, etc.) integrates these components on the substrate 350. The overmold material 360 may surround these components completely (e.g., all sides, top, bottom) or may only partially surround (e.g., not above) these components. The overmold material 360 may include through mold connections 361 for routing electrical signals through the overmold material 360. The overmold materials 330 and 360 can have thin thicknesses 322 and 323, respectively (e.g., thickness of 50 to 150 microns, 80 to 120 microns, etc.).

The compound semiconductor components 362 and 365 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 350 (or embedded within cavities of the substrate) at the beginning, during, or at the end of the processing for the substrate 350. Integrated passive device or die (IPD) 362 is coupled to the substrate 350 with connections (e.g., bumps, Cu pillars with solder cap on top, etc.). IPDs are assembled to the substrate 350 to enable RF front-end functionality as well as digital and analog functionalities.

Interconnect 359 (e.g., solder balls) electrically couple conductive layers of the substrates 320 and 350. Additionally an underfill 336 (e.g., a thermally conductive underfill 336, a non-thermally conductive underfill) allows the substrate 320 to be attached to the substrate 350. In one example, the underfill 336 is applied to an upper surface of overmold material 330 and then a lower surface of the overmold material 360 is applied to the underfill 336. The substrates and overmold materials of FIG. 3 can have different thicknesses, lengths, and widths dimensions. In one example, the substrates 320 and 350 and overmold materials 330 and 360 have a total thickness of 200 to 400 microns for an ultra thin form factor in an ultra thin electronic device.

FIG. 4A illustrates co-integrating different components in a microelectronic device (e.g., an inter die fabric architecture) utilizing ultra-thin package substrates in accordance with one embodiment. The microelectronic device 400 (e.g., an inter die fabric architecture 300) includes ultra thin package substrate 420 and antenna package 450 (e.g., copper based interconnects in low temperature co-fired ceramic materials, liquid crystal polymers, organic materials including ceramic/alumina/glass filled epoxides, glass, undoped silicon, etc.) arranged with a top side up three dimensional (3D) stack of two communication systems (e.g., 5G communication systems). The substrate 420 can have ultra thin thickness 421 (e.g., thickness of 50 to 100 microns, 50 to 80 microns, 60 to 70 microns, etc.) while the antenna substrate 450 may be thicker with a thickness 424. An optional substrate (e.g., printed circuit board, etc.) having conductive layers may be coupled to substrate 420 via secondary level interconnect 403 (e.g., solder balls 403). The substrate 420 includes organic dielectric material and conductive layers that are coupled to components 431-434 (e.g., compound semiconductor dies 431, 434, CMOS die 432, IPD 433). The overmold material 430 (e.g., organic mold compound materials including an epoxide matrix with ceramic/silica fillers, elastomer materials, or non-filled epoxides, etc.) at least partially encapsulates these components that are integrated by or onto the substrate 120. The overmold material 430 may surround these components completely (e.g., all sides, top, bottom) or may only partially surround (e.g., not above) these components. The overmold material 430 may include through mold connections 438 for routing electrical signals through the overmold material 430. The overmold material 430 can have a thin thickness 422 (e.g., thickness of 50 to 150 microns, 80 to 120 microns, etc.).

The compound semiconductor components 431 and 434 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 420 (or embedded within cavities of the substrate) at the beginning, during, or at the end of the processing for the substrate 420. Integrated passive device or die (IPD) 433 is coupled to the substrate 420 with connections (e.g., bumps, Cu pillars with solder cap on top, etc.). IPDs are assembled to the substrate 420 to enable RF front-end functionality as well as digital and analog functionalities.

The substrate 450 (e.g., antenna package substrate 450) includes organic dielectric material 451 and conductive layers 452 that are designed to form an antenna unit. The antenna package substrate can include an electromagnetic interference (EMI) shield 454 in proximity to any of the components 431-434. The EMI shield can be a conductive layer or a magnetic material (e.g., chromium oxide, ceramic ferrites, etc.).

Interconnect 458 (e.g., solder balls) and through mold connections 438 electrically couple conductive layers of the substrates 420 and 450. Additionally a thermally conductive underfill 436 allows the substrate 420 to be thermally coupled to the substrate 450. In one example, the underfill 436 is applied to an upper surface of overmold material 430 and then a lower surface of the substrate 450 is applied to the underfill 436. The underfill 436 does not need to be thermally conductive. The substrates and overmold material of FIG. 4 can have different thicknesses, lengths, and widths dimensions. In one example, the substrates 420 and 450 and overmold material 430 have a total thickness of 200 to 400 microns for an ultra thin form factor in an ultra thin electronic device.

Figure 4B:
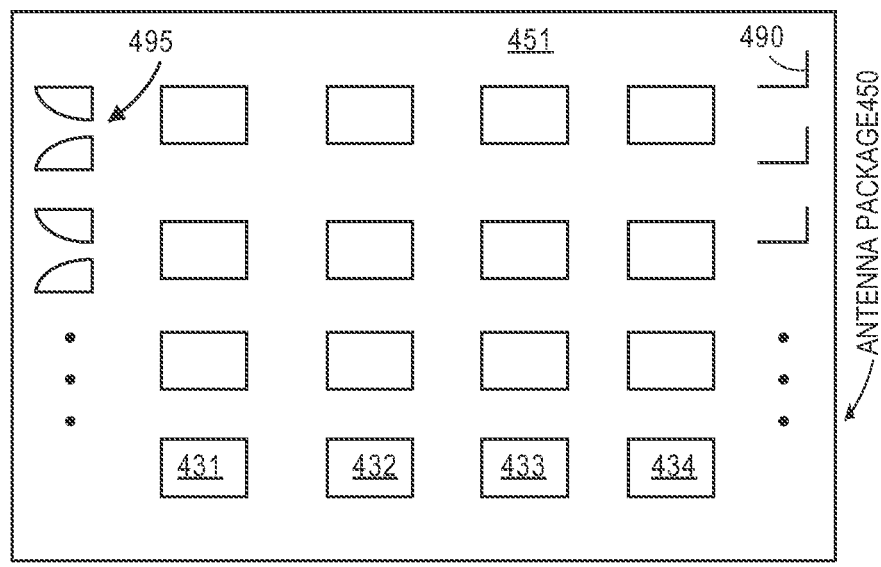
FIG. 4B illustrates a top view of a microelectronic device 400 (e.g., an inter die fabric architecture) utilizing ultra-thin package substrates in accordance with one embodiment.

FIG. 4B illustrates a top view of a microelectronic device 400 (e.g., an inter die fabric architecture) utilizing ultra-thin package substrates in accordance with one embodiment. The microelectronic device 400 (e.g., an inter die fabric architecture 400) includes ultra thin package substrates 420 and 450. The top view of device 400 illustrates organic material 451 and components 431-434. A periphery of the substrate 450 may include antennas 490 (e.g., monopole antennas) and antennas 495. Other types of antennas may also be included in this substrate 450.

FIG. 5A illustrates co-integrating different components in a microelectronic device (e.g., an inter die fabric architecture) utilizing ultra-thin package substrates in accordance with one embodiment. The microelectronic device 500 (e.g., an inter die fabric architecture 500) includes ultra thin package substrates 520 and 550 (copper based interconnects in low temperature co-fired ceramic materials, liquid crystal polymers, organic materials including ceramic/alumina/glass filled epoxides, glass, undoped silicon, etc.) arranged with a back to back three dimensional (3D) stack of two communication systems (e.g., 5G communication systems). The substrates 520 and 550 can have ultra thin thicknesses 522 and 523, respectively (e.g., thickness of 50 to 100 microns, 50 to 80 microns, 60 to 70 microns, etc.) or the antenna package can be thicker. Conductive layers 570-571 (e.g., pads 570-571) may be coupled to substrate 520 via secondary level interconnect 503 (e.g., solder balls 503) and through mold connections 538. The pads allow for connectivity to a board via slot or socket. The pads may be utilized as thermal slugs for thermal management. The substrate 520 includes organic dielectric material and conductive layers that are coupled to components 531-534 (e.g., compound semiconductor dies 531, 534, CMOS die 532, IPD 533). The overmold material 530 (e.g., organic mold compound materials including an epoxide matrix with ceramic/silica fillers, elastomer materials, or non-filled epoxides, etc.) at least partially encapsulates these components that are integrated by or onto the substrate 520. The overmold material 530 may surround these components completely (e.g., all sides, top, bottom) or may only partially surround (e.g., not above) these components. The overmold material 530 may include through mold connections 538 for routing electrical signals through the overmold material 530.

The compound semiconductor components 531 and 534 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 520 (or embedded within cavities of the substrate) at the beginning, during, or at the end of the processing for the substrate 520. Integrated passive device or die (IPD) 533 is coupled to the substrate 520 with connections (e.g., bumps, Cu pillars with solder cap on top, etc.). IPDs are assembled to the substrate 520 to enable RF front-end functionality as well as digital and analog functionalities.

The substrate 550 (e.g., antenna package substrate 550) includes organic dielectric material 551 and conductive layers 552 that are designed to form an antenna unit. The antenna package substrate or the substrate 520 can include an electromagnetic interference (EMI) shield in proximity to any of the components 531-534. The EMI shield 554 can be a conductive layer or a magnetic material (e.g., chromium oxide, ceramic ferrides, etc.). The overmold material 530 can have a thin thickness 521 (e.g., thickness of 50 to 150 microns, 80 to 120 microns, etc.).

Interconnect 558 (e.g., solder balls) electrically couple conductive layers of the substrates 520 and 550. Additionally a thermally conductive underfill 536 allows the substrate 520 to be attached to the substrate 550. The substrates and overmold material of FIG. 5A can have different thicknesses, lengths, and widths dimensions. In one example, the substrates 520 and 550 and overmold material 530 have a total thickness of 200 to 400 microns for an ultra thin form factor in an ultra thin electronic device.

Figure 5B:
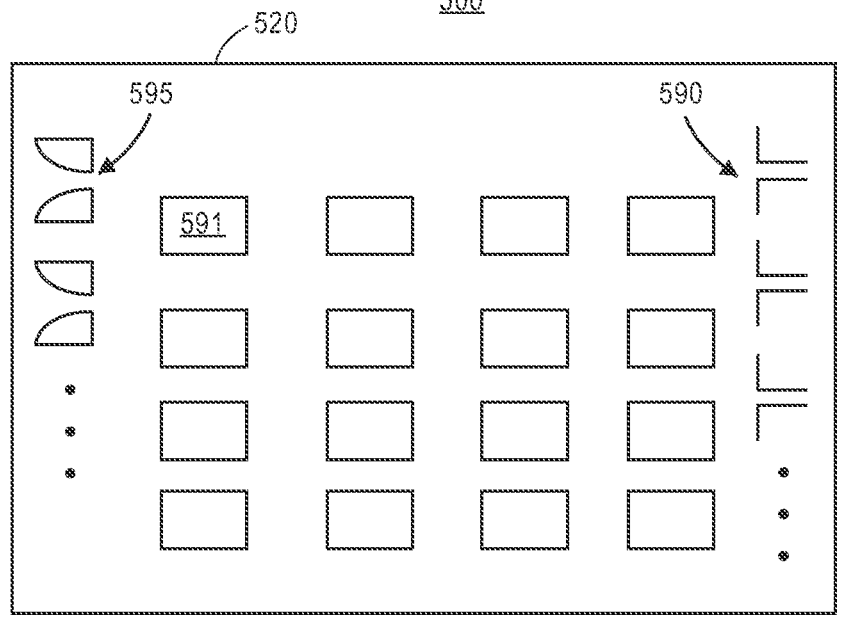
FIG. 5B illustrates a top view of the substrate 520 of the microelectronic device 500 (e.g., an inter die fabric architecture) in accordance with one embodiment.

FIG. 5B illustrates a top view of the substrate 520 of the microelectronic device 500 (e.g., an inter die fabric architecture) in accordance with one embodiment. The top view of substrate 520 illustrates organic material 551 and components 531-534. A periphery of the substrate 520 may include antennas 590 (e.g., dipole antennas) and antennas 595. Other types of antennas may also be included in this substrate 520.

FIG. 6 illustrates co-integrating different components in a microelectronic device (e.g., an inter die fabric architecture) utilizing ultra-thin package substrates in accordance with one embodiment. The microelectronic device 600 (e.g., an inter die fabric architecture 600) includes ultra thin package substrates 620 and 650 (e.g., copper based interconnects in low temperature co-fired ceramic materials, liquid crystal polymers, organic materials including ceramic/alumina/ glass filled epoxides, glass, undoped silicon, etc.) arranged with a cartridge or card like three dimensional (3D) stack of two communication systems (e.g., 5G communication systems) that integrates an additional antenna package with metal pad interconnects for slot loading or connecting into a connector receptacle. The substrates 620 and 650 can have ultra thin thicknesses 621 and 623, respectively (e.g., thickness of 50 to 80 microns, 60 to 70 microns, etc.). The substrate 620 includes organic dielectric material 602 and conductive layers that are coupled to components 631-634 (e.g., compound semiconductor dies 631, 634, CMOS die 632, IPD 633). The overmold material 630 (e.g., organic mold compound materials including an epoxide matrix with ceramic/silica fillers, elastomer materials, or non-filled epoxides, etc.) at least partially encapsulates these components that are integrated by or onto the substrate 620. The overmold material 630 may surround these components completely (e.g., all sides, top, bottom) or may only partially surround (e.g., not above) these components. The conductive layer 626 may be a contact line, rail, or slot for insertion into a card-holder like interface.

The compound semiconductor components 631 and 634 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 620 (or embedded within cavities of the substrate) at the beginning, during, or at the end of the processing for the substrate 620. Integrated passive device or die (IPD) 633 is coupled to the substrate 620 with connections (e.g., bumps, Cu pillars with solder cap on top, etc.). IPDs are assembled to the substrate 620 to enable RF front-end functionality as well as digital and analog functionalities.

The substrate 620 may also include an antenna package substrate 680 having an antenna unit and mold material 681.

The substrate 650 includes organic dielectric material 651 and conductive layers that are coupled to components 662-665 (e.g., compound semiconductor dies 662, 665, CMOS die 663, IPD 664). The overmold material 660 (e.g., organic mold compound materials including an epoxide matrix with ceramic/silica fillers, elastomer materials, or non-filled epoxides, etc.) at least partially encapsulates these components that are integrated by or onto the substrate 650. The overmold material 660 may surround these components completely (e.g., all sides, top, bottom) or may only partially surround (e.g., not above) these components. The overmold materials 630 and 660 can have thin thicknesses 622 and 624, respectively (e.g., thickness of 50 to 150 microns, 80 to 120 microns, etc.). The conductive layer 656 may be a contact line, rail, or slot for insertion into a card-holder like interface.

Adhesive 654 is used to attach the substrates 620 and 650 to each other. The substrates 620 and 650 include in-package wireless communication structures 652 for wireless communications between substrates 620 and 650. Substrate 620 includes a communication structure 652b and substrate 650 includes a communication structure 652a.

The substrates and overmold materials of FIG. 6 can have different thicknesses, lengths, and widths dimensions. In one example, the substrates 620 and 650 and overmold materials 630 and 660 have a total thickness of 200 to 400 microns for an ultra thin form factor in an ultra thin electronic device.

Figure 7:
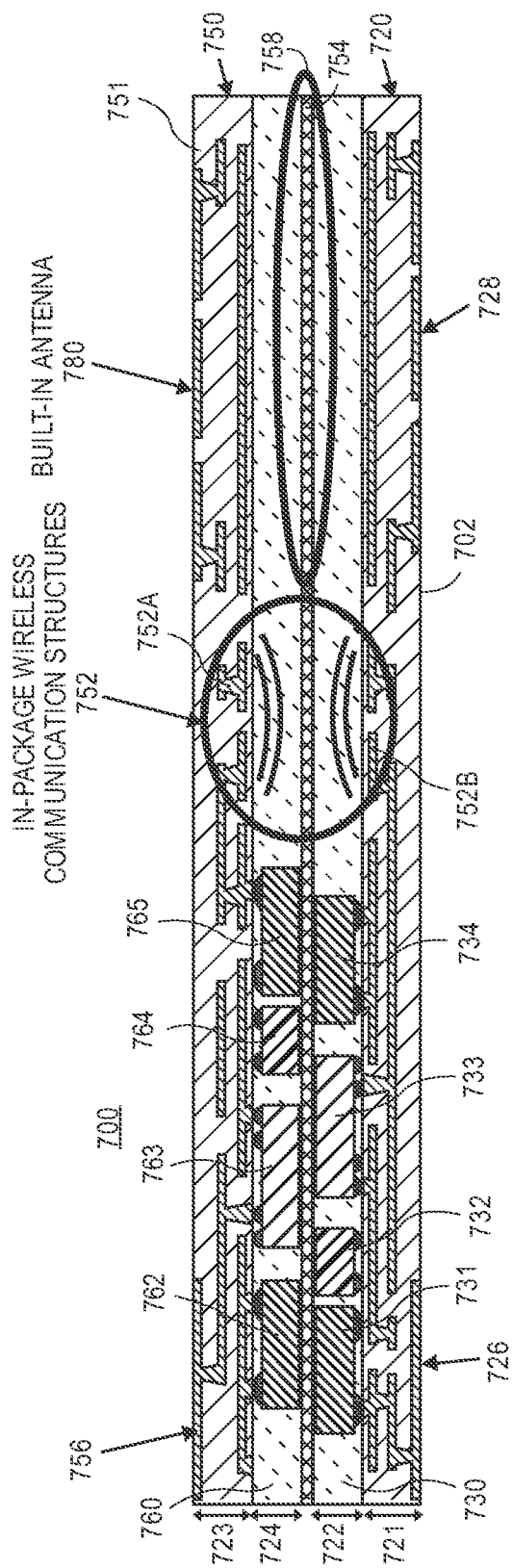
FIG. 7 illustrates co-integrating different components in a microelectronic device (e.g., an inter die fabric architecture) utilizing ultra-thin package substrates in accordance with one embodiment.

FIG. 7 illustrates co-integrating different components in a microelectronic device (e.g., an inter die fabric architecture) utilizing ultra-thin package substrates in accordance with one embodiment. The microelectronic device 700 (e.g., an inter die fabric architecture 700) includes ultra thin package substrates 720 and 750 (e.g., copper based interconnects in low temperature co-fired ceramic materials, liquid crystal polymers, organic materials including ceramic/alumina/glass filled epoxides, glass, undoped silicon, etc.) arranged with a cartridge or card like three dimensional (3D) stack of two communication systems (e.g., 5G communication systems) that integrates built in antenna packages with metal pad interconnects for slot loading or connecting into a connector receptacle. The substrates 720 and 750 can have ultra thin thicknesses 721 and 723, respectively (e.g., thickness of 50 to 80 microns, 60 to 70 microns, etc.). The substrate 720 includes organic dielectric material 702 and conductive layers that are coupled to components 731-734 (e.g., compound semiconductor dies 731, 734, CMOS die 732, IPD 733). The overmold material 730 (e.g., organic mold compound materials including an epoxide matrix with ceramic/silica fillers, elastomer materials, or non-filled epoxides, etc.) at least partially encapsulates or integrates these components that are integrated by or onto the substrate 720. The overmold material 730 may surround these components completely (e.g., all sides, top, bottom) or may only partially surround (e.g., not above) these components. The conductive layer 726 may be a contact line, rail, or slot for insertion into a card-holder like interface.

The compound semiconductor components 731 and 734 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.) may be fabricated with a different process (e.g., GaAs, GaN, etc.) and then attached to the substrate 720 (or embedded within cavities of the substrate) at the beginning, during, or at the end of the processing for the substrate 720. Integrated passive device or die (IPD) 733 is coupled to the substrate 720 with connections (e.g., bumps, Cu pillars with solder cap on top, etc.). IPDs are assembled to the substrate 720 to enable RF front-end functionality as well as digital and analog functionalities. The substrate 720 may also include a built-in antenna unit 728.

The substrate 750 includes organic dielectric material 751 and conductive layers that are coupled to components 762-765 (e.g., compound semiconductor dies 762, 765, CMOS die 763, IPD 764). The overmold material 760 (e.g., organic mold compound materials including an epoxide matrix with ceramic/silica fillers, elastomer materials, or non-filled epoxides, etc.) at least partially encapsulates these components that are integrated by or onto the substrate 750. The overmold material 760 may surround these components completely (e.g., all sides, top, bottom) or may only partially surround (e.g., not above) these components. The overmold materials 730 and 760 can have thin thicknesses 722 and 724, respectively (e.g., thickness of 50 to 150 microns, 80 to 120 microns, etc.).

Adhesive 754 is used to attach the substrates 720 and 750 to each other. In one example, the adhesive 754 is a conducting glue in a region 758 to remove needing to have a ground plane in the substrates 720 and 750 for the antenna units 728 and 780, respectively. The conducting glue also allows for a greater ground to antenna element distance if a ground is required. The substrates 720 and 750 include in-package wireless communication structures 752 for wireless communications between substrates 720 and 750. Substrate 720 includes a communication structure 752b and substrate 750 includes a communication structure 752a.

The substrates and overmold materials of FIG. 7 can have different thicknesses, lengths, and widths dimensions. In one example, the substrates 720 and 750 and overmold materials 730 and 760 have a total thickness of 200 to 400 microns for an ultra thin form factor in an ultra thin electronic device.

For those skilled in the art it is noted that the above embodiments illustrated do not capture all possible implementations of the present design and that combinations of above embodiments may lead to new embodiments that can be viewed as part of this present design. In example there can be implementations with back-to-back stacked 5G systems as in FIG. 2 without the short range wireless communication. Also the embodiments shown in FIGS. 5 and 6 may have through mold connections and use those to connect to each other by soldering instead of wireless communication.

The present design focuses on the use of ultra-thin substrate technology in conjunction with integrated passive devices, embedded wafer level package (eWLP), embedded wafer level ball (eWLB), chip-scale packages or systems in package and/or thinned dies to achieve thickness form-factors for 5G systems that were previously not possible and allow for 5G systems integration in very z-height restricted spaces which may both be consumer electronics (e.g., mobile devices, wearable devices, etc.) or industrial 5G applications. With respect to ultra-thin substrates, depending on system complexity, these substrates can have typically 2-6 layers with an individual layer thickness of 5-20 um resulting in an exemplary substrate thickness of 20-100 um for a 4-layer substrate. In conjunction with thin package, passive and die form-factors, a total system z-height of less than 200 um can be achieved, yet obtain a fully functional 5G system. It is also noted that different layers may have different thicknesses in order to accommodate power delivery or signaling or both.

Figure 8:
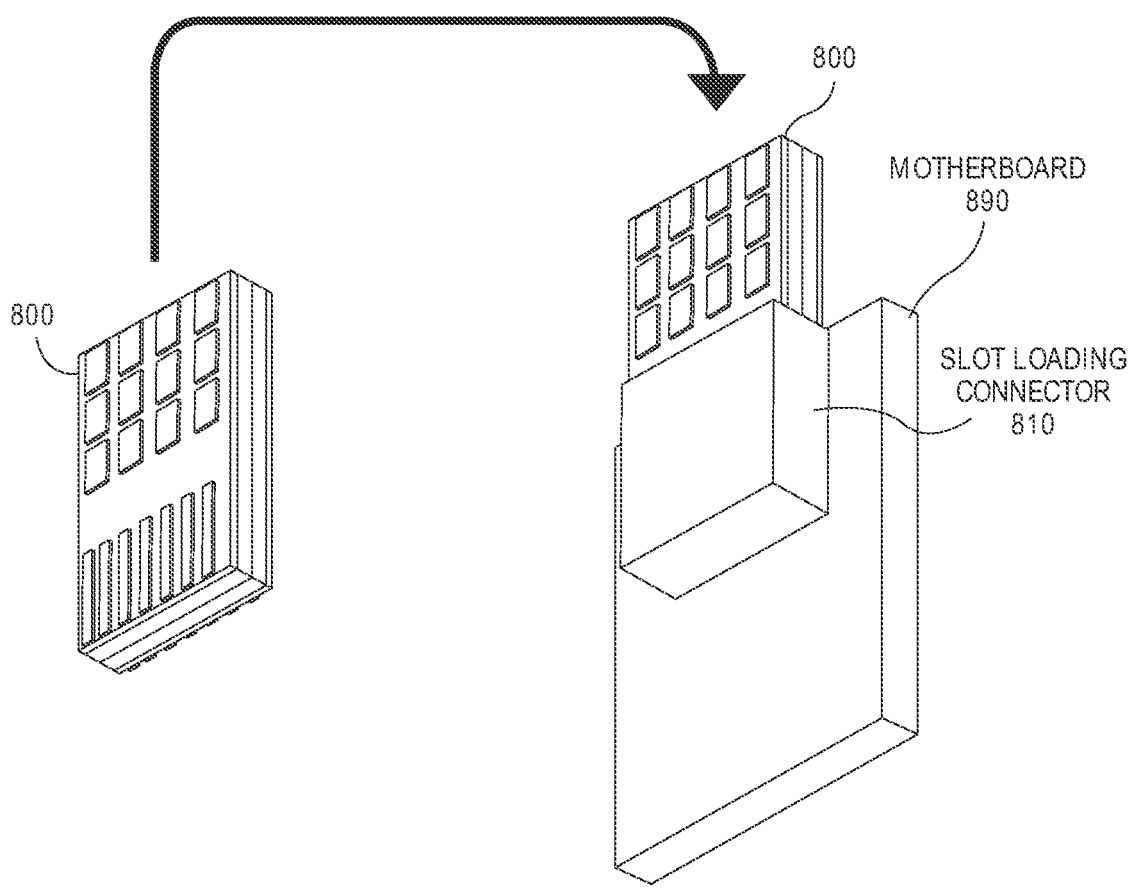
FIG. 8 illustrates a microelectronic device being inserted into a slot loading connector in accordance with one embodiment.

One possible application of an ultra thin communication system that utilizes the microelectronic device 600 is illustrated in FIG. 8. FIG. 8 illustrates a microelectronic device being inserted into a slot loading connector in accordance with one embodiment. A microelectronic device 800 (e.g., microelectronic device 600) is inserted into a slot loading connector 810 that is positioned on a board 890 (e.g., mother board of a server, mobile device, computing device, internet of things device, etc.). FIG. 8 illustrates an embodiment of the present design that provides a memory-card type 5G solution that can be inserted into a slot connector and provide on-demand 5G connectivity to any system having the desired connectivity. This may also allow for easily exchangeable 5G solutions that can satisfy changing standards and/or needs and/or systems, carrier, and frequency band development.

Figure 9A:
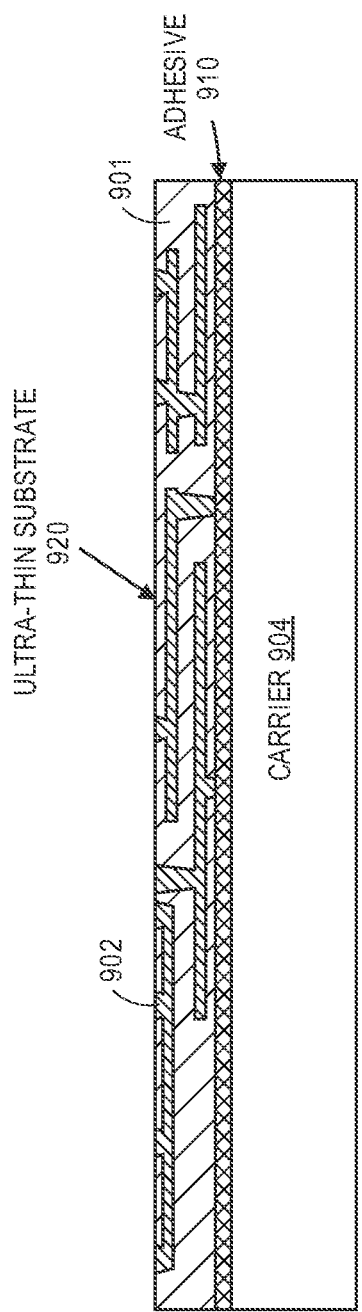
FIGS. 9A-9D illustrate part of a process flow for manufacturing embodiments of the present design including ultra-thin substrates of a microelectronic device.
Figure 9B:
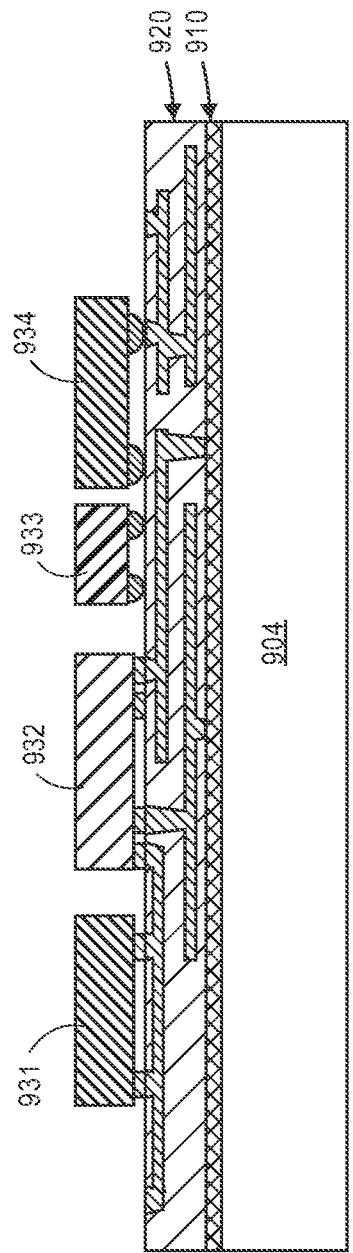
Figure 9C:
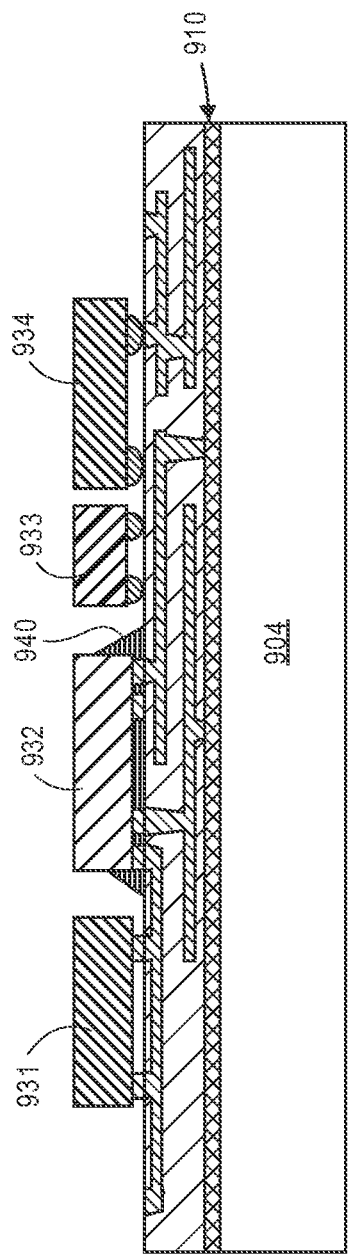
Figure 9D:
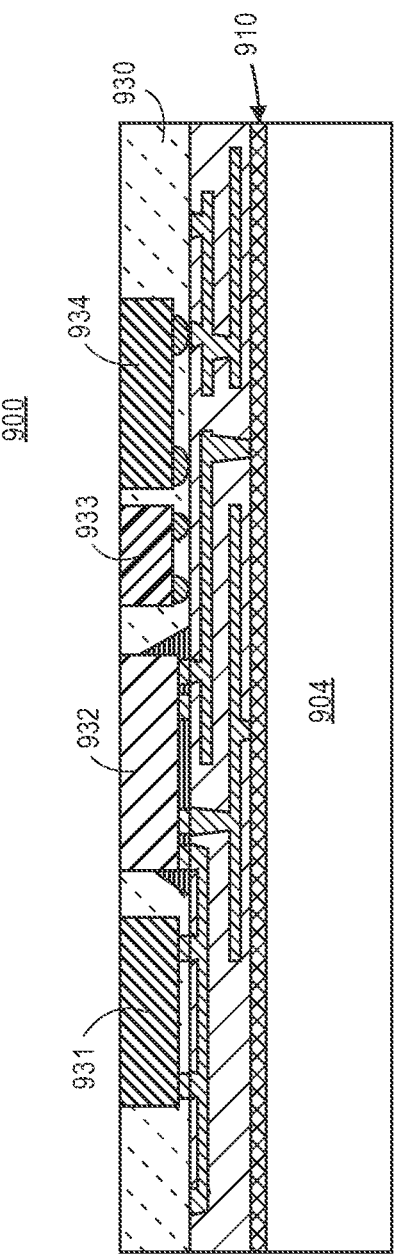

FIGS. 9A-9D illustrate part of a process flow for manufacturing embodiments of the present design including ultra-thin substrates of a microelectronic device. In these illustrations, the ultra-thin substrate is held flat/fixed to a carrier substrate. While this seems to be a preferred method emerging in the industry a free standing layer that is held flat by the means of adequately designed handling media can also be considered. The process flow in FIG. 9A includes starting with an ultra-thin substrate 920 on a carrier 904. The substrate 920 includes organic material 901 and conductive layers 902. The format of the carrier and the ultra-thin substrate thereon can be unit, strip or panel to which the ultra-thin substrate is attached by means of an adhesive 910 (e.g., thermally conductive adhesive, electrically conductive adhesive). In a subsequent operation of FIG. 9B, electronic components 931-934 (e.g., compound semiconductor dies 931, 934, CMOS die 932, IPD 933) including passives, IPDs (integrated passive devices), dies, SiPs, SoPs, and modules are assembled to the ultra-thin substrate. This can be done in a single operation or several assembly operations (i.e., some components can be assembled in one and some in another assembly operation). Then any component that requires additional strengthening or protection of interconnects is underfilled as illustrated in FIG. 9C. Underfill 940 is performed for the die 932 for additional strengthening or protection of the interconnects associated with this die if the mold operation does not underfill all the components at the molding operation. Subsequently the components 931-934 of the microelectronic device 900 are molded as illustrated in FIG. 9D with mold material 930. This operation can be unit-level, strip-level or panel-level mold. The mold itself will usually cover all components. If a back grinding (e.g., post-mold-grind) operation is required to reveal a surface of a component then this operation will be completed at this point.

Figure 10A:
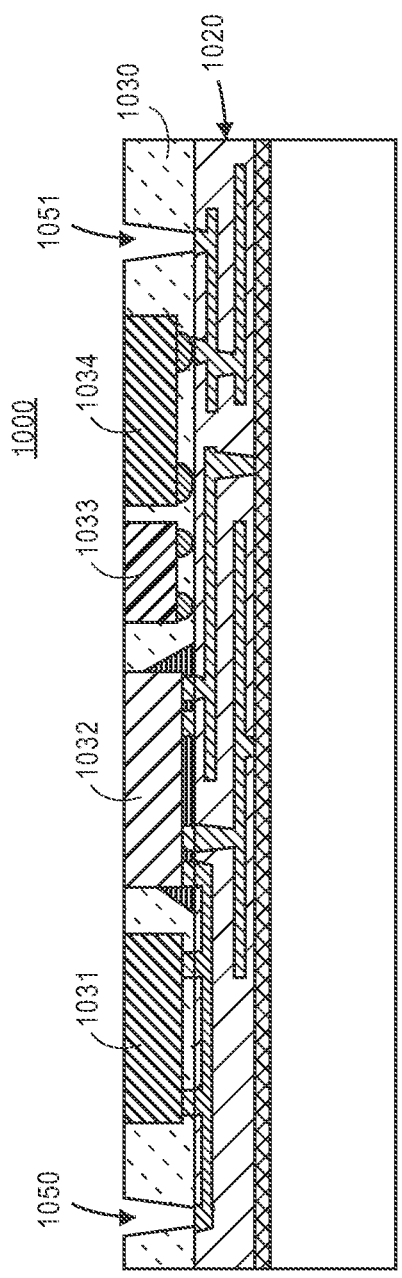
FIGS. 10A-10C illustrate through mold connection processing in accordance with one embodiment.
Figure 10B:
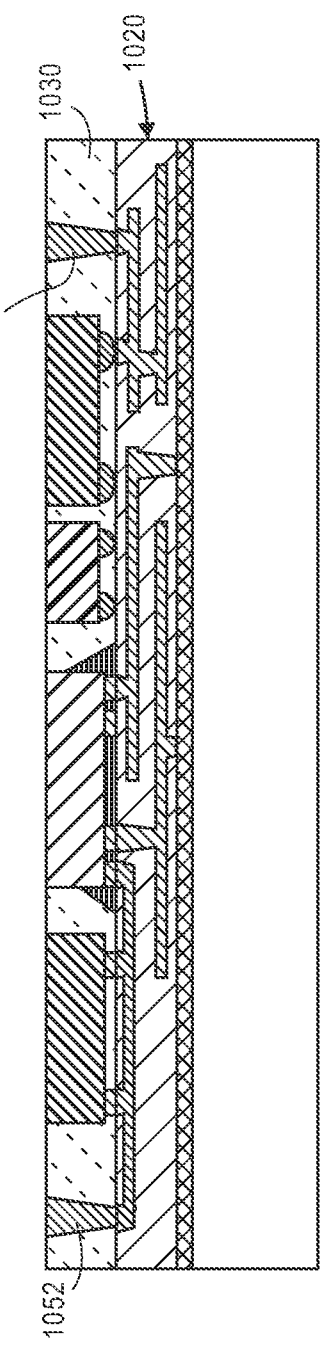
Figure 10C:
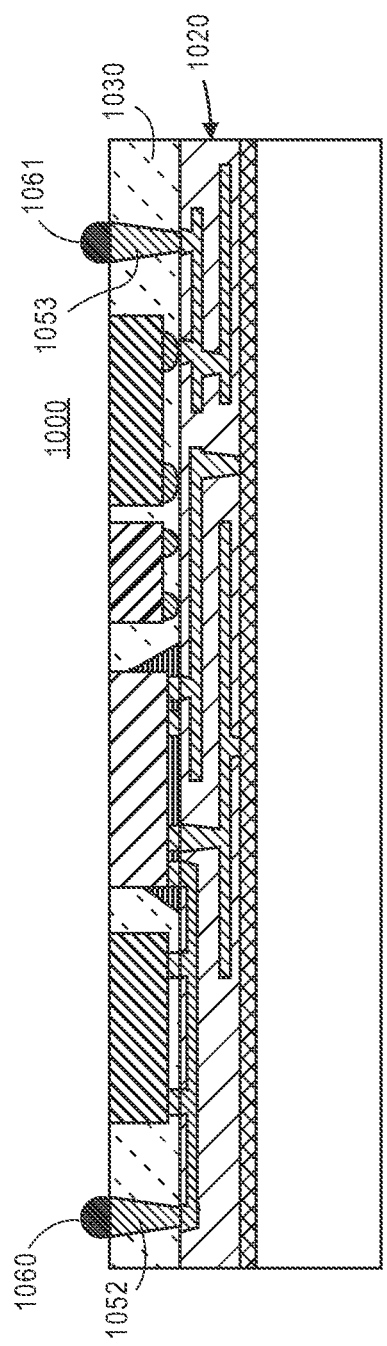

If through mold connections are required at this point, then through mold via processing may be completed as illustrated in FIGS. 10A-10C in accordance with one embodiment. A microelectronic device 1000 includes similar components 1031-1034, substrate 1020, and mold material 1030 in comparison to the microelectronic device 900. In one example, through mold processing includes drilling holes 1050-1051 through the mold material 1030 (e.g., by mechanical drill, etch dry/chemical) as illustrated in FIG. 10A, then filling the holes with metal by plating, solder paste printing or solder ball placement to form the conductive connections 1052-1053 as illustrated in FIG. 10B. Finally, the solder balls 1060-1061 are created by solder printing or solder ball placement as illustrated in FIG. 10C. Alternatively some ultra-thin substrates may have already conductive connections (e.g., Copper pillars) that will serve as pillar interconnects through the mold. In this case after molding these pillars will require revealing in an already discussed post-mold grind. The creation of through mold interconnects then includes creating solder balls at the surface of the through mold pillars. Other through mold interconnect architectures may also be utilized and embodiments of the present design are not pertinent to this.

Figure 11A:
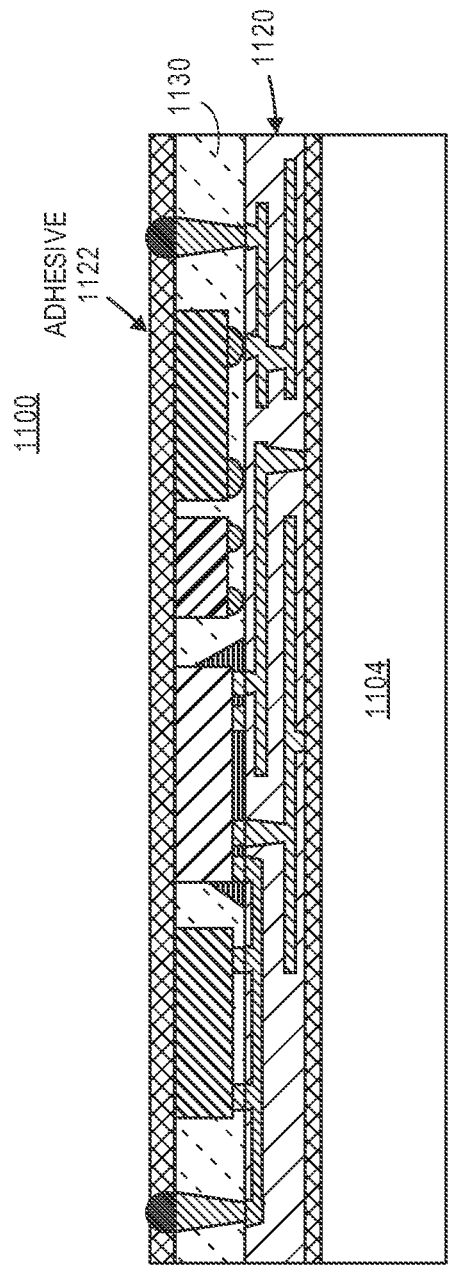
Figure 11B:
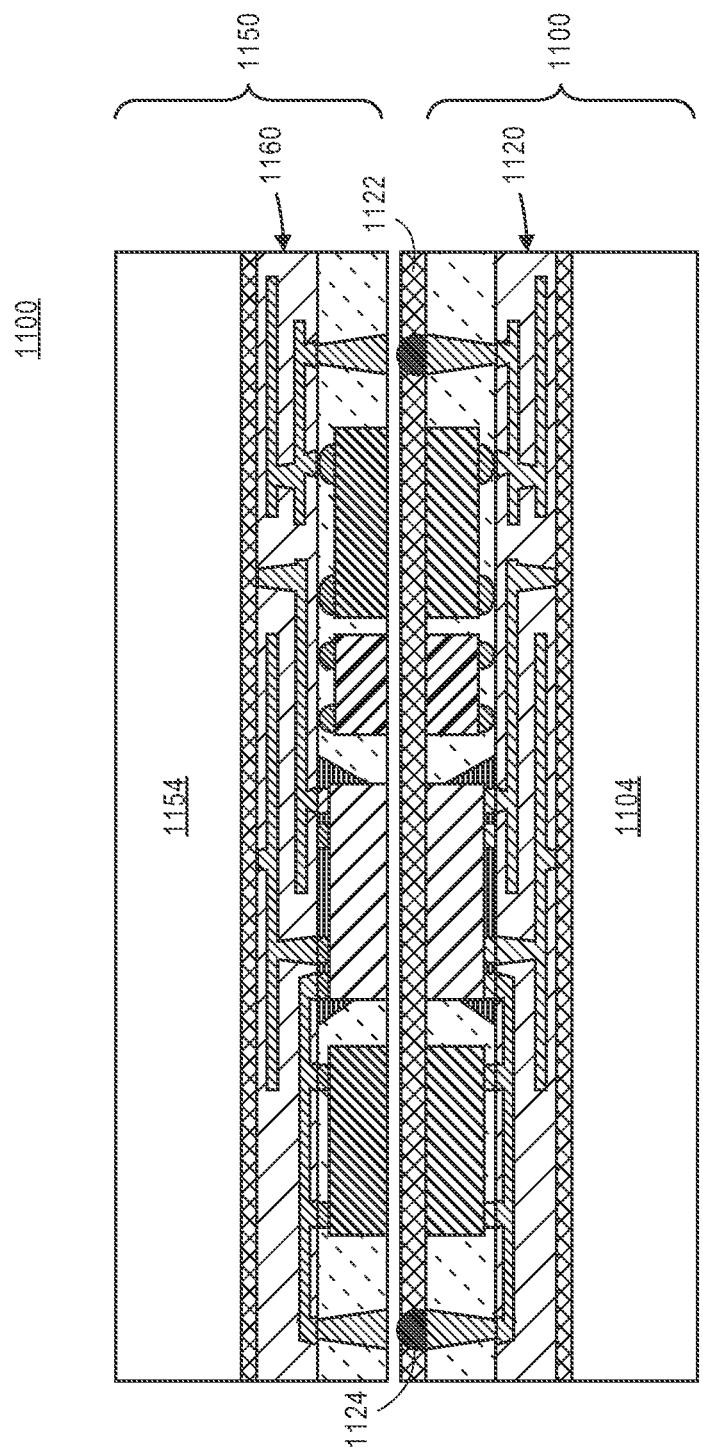
Figure 11C:
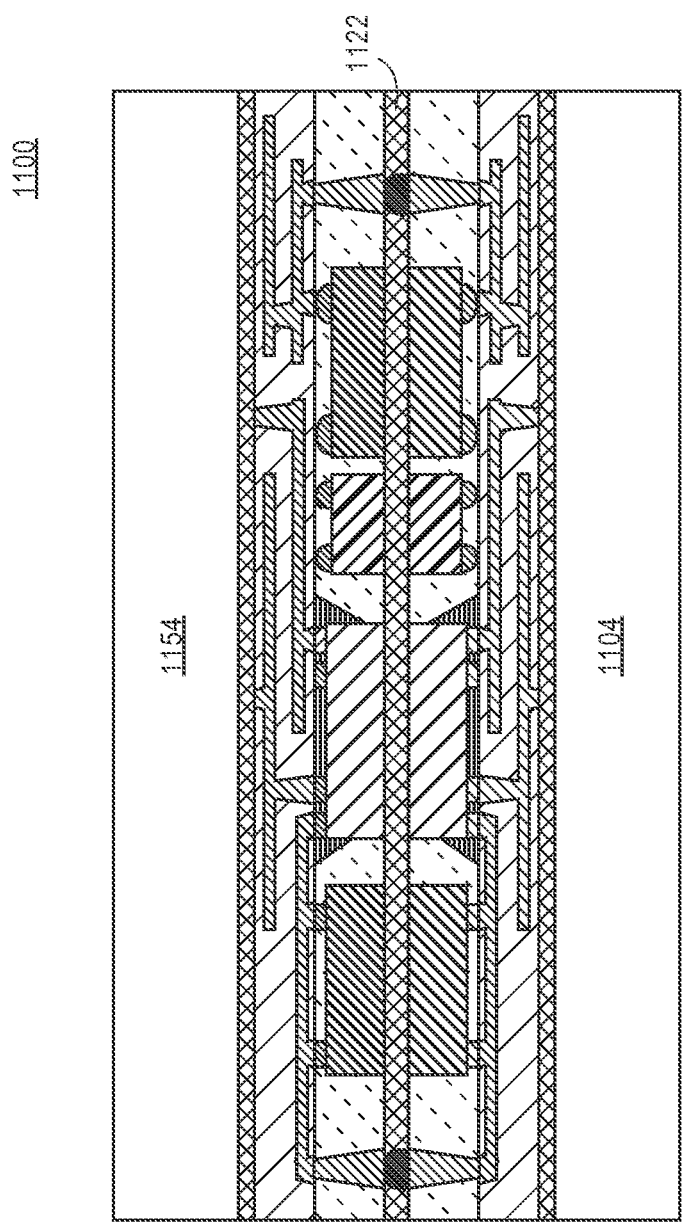

FIGS. 11A-11E illustrate front-to-front or top-to-top module 3D connectivity in accordance with one embodiment. A microelectronic device 1100 includes similar components, substrate 1120, and mold material 1130 in comparison to the microelectronic device 1000. A carrier 1104 supports the substrate 1120. If adhesive is required to connect the two modules this adhesive 1122 is dispensed on a surface of one of the modules 1100 (e.g., microelectronic device 1100) as illustrated in FIG. 11A. Then a second module 1150 (e.g., microelectronic device 1150) with its carrier 1154 and substrate 1160 is placed on top of the first module 1100 and the 2 modules are assembled to each other either through the adhesive 1122 or through solder interconnects 1124 or both as illustrated in FIG. 11B. A reflow and/or cure operation occurs as illustrated in FIG. 11C. At the end of the process flow both carriers are detached as illustrated in FIG. 11D. The carriers 1104 and 1154 are removed with thermal, mechanical, or optical means. If required solder bumps 1125-1127 are created on one module as illustrated in FIG. 11E.

Figure 12C:
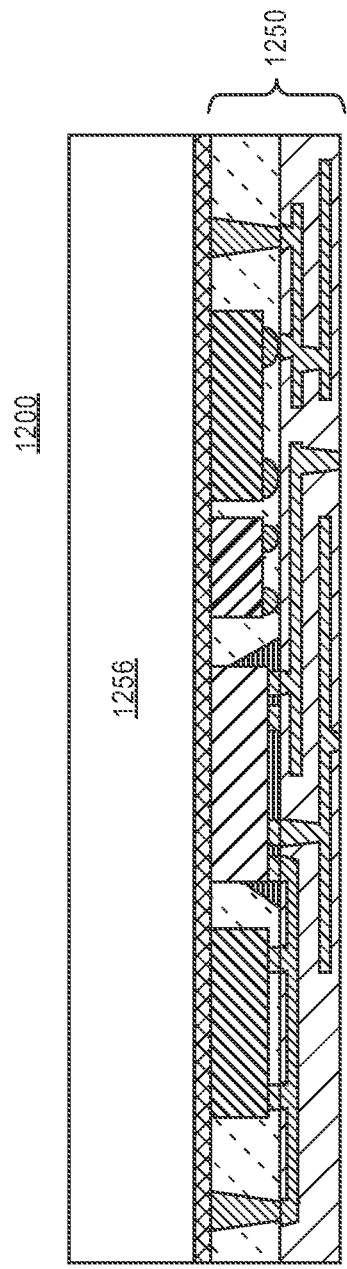
Figure 12D:
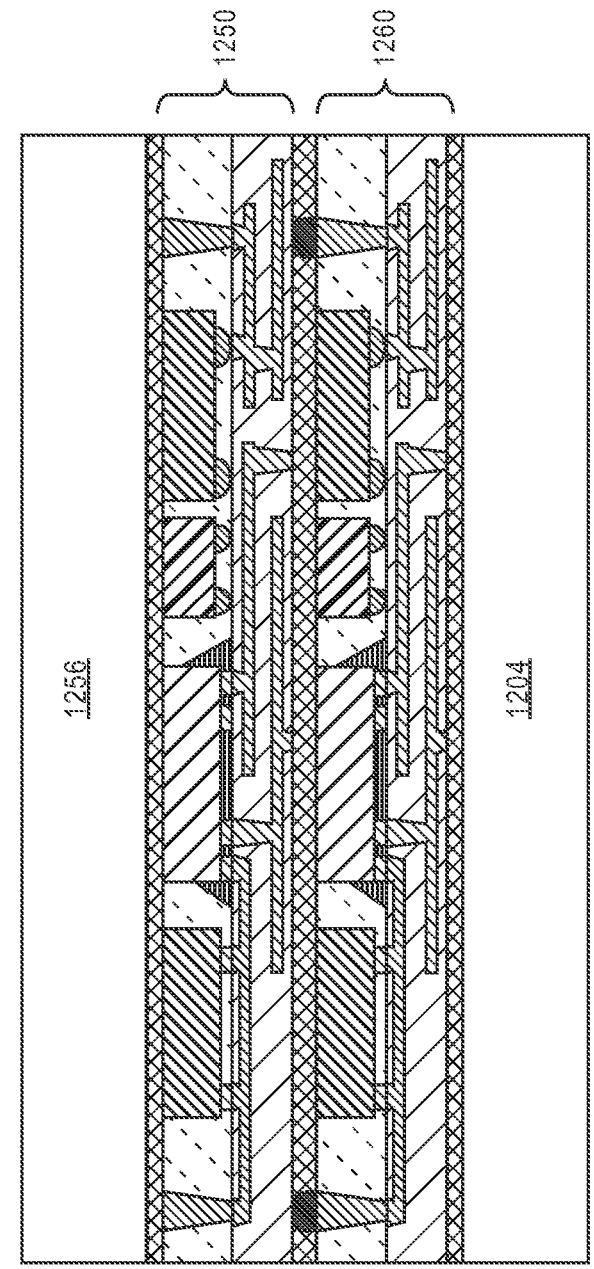
Figure 12E:
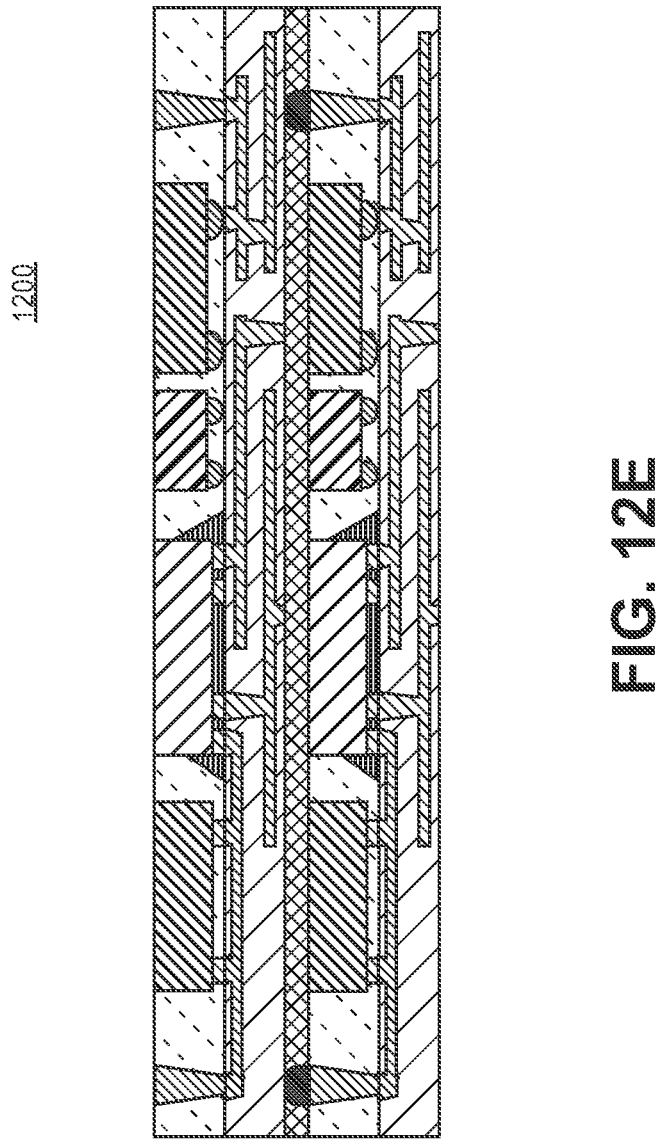

FIGS. 12A-12E illustrate top to back module 3D connectivity in accordance with one embodiment. A microelectronic device 1200 includes similar components, substrate 1220, and mold material 1230 in comparison to the microelectronic device 1100. A carrier 1204 supports the substrate 1220. If adhesive is required to connect the two modules this adhesive 1222 is dispensed on a surface of one of the modules 1200 (e.g., microelectronic device 1200) as illustrated in FIG. 12A. Then a second carrier 1256 is placed on top of the second module 1250 having a substrate 1260 as illustrated in FIG. 12B. A lower carrier 1254 is detached from the second module 1250 as illustrated in FIG. 12C. The carrier is removed with thermal, mechanical, or optical means. Then this module 1250 is attached to the first module 1200 by solder or adhesive or both as illustrated in FIG. 12D. FIG. 12E illustrates removal of the carriers 1204 and 1256. If required solder bumps are created on either module.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 13:
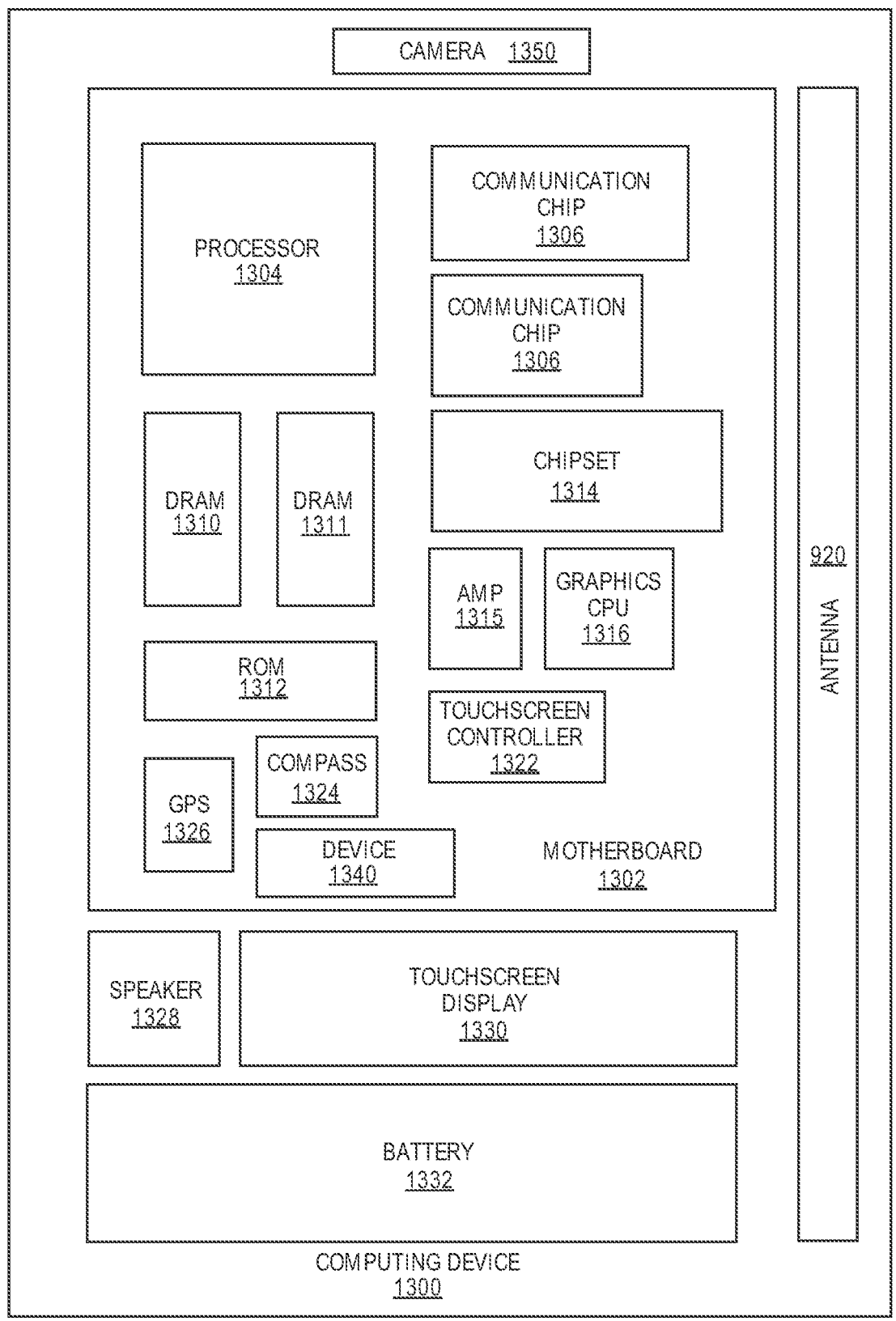
FIG. 13 illustrates a computing device 1300 in accordance with one embodiment.

FIG. 13 illustrates a computing device 1300 in accordance with one embodiment. The computing device 900 houses a board 1302. The board (e.g., motherboard, printed circuit board, etc.) may include a number of components, including but not limited to at least one processor 1304 and at least one communication module or chip 1306. The at least one processor 1304 is physically and electrically coupled to the board 1302. In some implementations, the at least one communication module or chip 1306 is also physically and electrically coupled to the board 1302. In further implementations, the communication module or chip 1306 is part of the processor 1304. In one example, the communication module or chip 1306 (e.g., microelectronic device 100, 200, 300, 400, 500, 600, 700, 800, 900, 1000, 1100, 1150, 1200, 1250, etc.) includes an antenna unit 1320 (e.g., antenna unit 192, 292, 392, 492, etc.).

Depending on its applications, computing device 1300 may include other components that may or may not be physically and electrically coupled to the board 1302. These other components include, but are not limited to, volatile memory (e.g., DRAM 1310, 1311), non-volatile memory (e.g., ROM 1312), flash memory, a graphics processor 13916, a digital signal processor, a crypto processor, a chipset 1314, an antenna unit 1320, a display, a touchscreen display 1330, a touchscreen controller 1322, a battery 1332, an audio codec, a video codec, a power amplifier 1315, a global positioning system (GPS) device 1326, a compass 1324, a gyroscope, a speaker, a camera 1350, and a mass storage device (such as hard disk drive, compact disk (CD), digital versatile disk (DVD), and so forth).

The communication module or chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication modules or chips 1306. For instance, a first communication chip 1306 may be dedicated to shorter range wireless communications such as Wi-Fi, WiGig, and Bluetooth and a second communication chip 1306 may be dedicated to longer range wireless communications such as GPS, EDGE, GPRS, CDMA, WiMAX, LTE, Ev-DO, 5G, and others.

The at least one processor 1304 of the computing device 1300 includes an integrated circuit die packaged within the at least one processor 1304. In some embodiments of the invention, the processor package includes one or more devices, such as microelectronic devices (e.g., microelectronic device 100, 200, 300, 400, 500, 600, 700, 800, 900, 1000, 1100, 1150, 1200, 1250, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of embodiments of the invention, the communication chip package includes one or more microelectronic devices (e.g., microelectronic device 100, 200, 300, 400, 500, 600, 700, 800, 900, 1000, 1100, 1150, 1200, 1250, etc.).

The following examples pertain to further embodiments. Example 1 is a microelectronic device that includes a first ultra thin substrate formed of organic dielectric material and conductive layers, a first mold material to at least partially encapsulate first radio frequency (RF) components that are integrated with the first substrate, and a second ultra thin substrate being coupled to the first ultra thin substrate. The second ultra thin substrate is formed of organic dielectric material and conductive layers and a second mold material to at least partially encapsulate second radio frequency (RF) components that are integrated with the second substrate.

In example 2, the subject matter of example 1 can optionally include the first and second ultra thin substrates each having a thickness of 50 to 80 microns.

In example 3, the subject matter of any of examples 1-2 can optionally include the first and second mold materials each having a thickness of 50 to 150 microns.

In example 4, the subject matter of any of examples 1-3 can optionally include a lower surface of the first substrate being disposed on an upper surface of the second mold material of the second substrate to form a three dimensional stacked package.

In example 5, the subject matter of any of examples 1-4 can optionally include a lower bottom surface of the first substrate being disposed on a lower bottom surface of the second substrate to form a three dimensional stacked package.

In example 6, the subject matter of any of examples 1-5 can optionally include the first substrate including an in-package first wireless communication structure for communicating with an in-package second wireless communication structure of the second substrate.

In example 7, the subject matter of any of examples 1-6 can optionally include an upper surface of the first mold material of the first substrate being disposed on an upper surface of the second mold material of the second substrate to form a three dimensional stacked package.

In example 8, the subject matter of any of examples 1-7 can optionally include the first substrate including an in-package first antenna unit for communicating with external devices and the second substrate including an in-package second antenna unit for communicating with external devices.

In example 9, the subject matter of any of examples 1-8 can optionally include a conductive glue for attaching an upper surface of the first mold material of the first substrate to an upper surface of the second mold material of the second substrate to form a three dimensional stacked package. The conductive glue allows the first and second substrates to not include a ground plane for the first and second antenna units.

In example 10, the subject matter of any of examples 1-9 can optionally include a third substrate coupled to at least one of the first and second substrates. The third substrate includes organic dielectric layers and conductive layers for forming an antenna unit for communicating with external devices.

In example 11, the subject matter of any of examples 1-10 can optionally include the first and second substrates each including conductive layers for forming contact lines for insertion into a card holder interface.

In example 12, the subject matter of any of examples 1-11 can optionally include the microelectronic device comprising a 5G package architecture for 5G communications.

Example 13 is a microelectronic device comprising an ultra thin substrate having radio frequency (RF) components and an antenna substrate coupled to the ultra thin substrate. The antenna substrate includes organic dielectric layers and conductive layers for forming an antenna unit for transmitting and receiving communications at a frequency of approximately 4 GHz or higher. A mold material at least partially encapsulates the RF components that are integrated with the ultra thin substrate.

In example 14, the subject matter of example 13 can optionally include the ultra thin substrate having a thickness of 50 to 80 microns.

In example 15, the subject matter of any of examples 13-14 can optionally include the mold material having a thickness of 50 to 150 microns.

In example 16, the subject matter of any of examples 13-15 can optionally include the antenna substrate being disposed on a lower bottom surface of the ultra thin substrate to form a three dimensional stacked package.

In example 17, the subject matter of any of examples 13-16 can optionally include the antenna substrate being disposed on an upper surface of the mold material of the ultra thin substrate to form a three dimensional stacked package.

In example 18, the subject matter of any of examples 13-17 can optionally include an electromagnetic interference (EMI) shield integrated with the ultra thin substrate or the antenna substrate to shield the RF components from EMI.

Example 19 is a computing device comprising at least one processor to process data and a communication module or chip coupled to the at least one processor. The communication module or chip comprises a first ultra thin substrate formed of organic dielectric material and conductive layers, a mold material to integrate radio frequency (RF) components with the first substrate, and a second ultra thin substrate being electrically coupled to the first ultra thin substrate. The second ultra thin substrate is formed of organic dielectric material and conductive layers.

In example 20, the subject matter of example 19 can optionally include the first and second ultra thin substrates each having a thickness of 50 to 80 microns.

In example 21, the subject matter of any of examples 19-20 can optionally include the first substrate including an in-package first wireless communication structure for communicating with an in-package second wireless communication structure of the second substrate.

In example 22, the subject matter of any of examples 19-21 can optionally include the first substrate including an in-package first antenna unit for communicating with external devices and the second substrate including an in-package second antenna unit for communicating with external devices.

In example 23, the subject matter of any of examples 19-22 can optionally include the first and second substrates each including conductive layers for forming contact lines for insertion into a card holder interface.

What is claimed is:
1. A microelectronic device comprising:
a first ultra thin substrate formed of organic dielectric material and a plurality of conductive layers each including a level of lateral interconnects, wherein the first substrate includes an in-package first antenna unit integrated therein;
a first mold material to at least partially encapsulate first radio frequency (RF) components that are integrated with the first substrate, wherein the first mold material has an uppermost surface opposite the first ultra thin substrate, and wherein the uppermost surface of the first mold material is co-planar with an uppermost surface of one or more of the first RF components;
a second ultra thin substrate being coupled to the first ultra thin substrate, the second ultra thin substrate formed of organic dielectric material and a plurality of conductive layers each including a level of lateral interconnects, wherein the second substrate includes an in-package second antenna unit integrated therein; and
a second mold material to at least partially encapsulate second radio frequency (RF) components that are integrated with the second substrate, wherein the second mold material has an uppermost surface opposite the second ultra thin substrate, and wherein the uppermost surface of the second mold material is co-planar with an uppermost surface of one or more of the second RF components.

2. The microelectronic device of claim 1, wherein the first and second ultra thin substrates each have a thickness of 50 to 80 microns.

3. The microelectronic device of claim 1, wherein the first and second mold materials each have a thickness of 50 to 150 microns.

4. The microelectronic device of claim 1, wherein a lower surface of the first substrate is disposed on an upper surface of the second mold material of the second substrate to form a three dimensional stacked package.

5. The microelectronic device of claim 1, wherein a lower bottom surface of the first substrate is disposed on a lower bottom surface of the second substrate to form a three dimensional stacked package.

6. The microelectronic device of claim 1, wherein the first substrate includes an in-package first wireless communication structure for communicating with an in-package second wireless communication structure of the second substrate.

7. The microelectronic device of claim 1, wherein an upper surface of the first mold material of the first substrate is disposed on an upper surface of the second mold material of the second substrate to form a three dimensional stacked package.

8. The microelectronic device of claim 1, wherein the first substrate includes the in-package first antenna unit for communicating with external devices and the second substrate includes the in-package second antenna unit for communicating with external devices.

9. The microelectronic device of claim 8, further comprising:
a conductive glue for attaching an upper surface of the first mold material of the first substrate to an upper surface of the second mold material of the second substrate to form a three dimensional stacked package, the conductive glue to allow the first and second substrates to not include a ground plane for the first and second antenna units.

10. The microelectronic device of claim 1, further comprising:

a third substrate coupled to at least one of the first and second substrates, the third substrate includes organic dielectric layers and conductive layers for forming an antenna unit for communicating with external devices.

11. The microelectronic device of claim 1, wherein the first and second substrates each include conductive layers for forming contact lines for insertion into a card holder interface.

12. The microelectronic device of claim 1, wherein the microelectronic device comprises a 5G package architecture for 5G communications.

13. A microelectronic device comprising:
a first ultra thin substrate having radio frequency (RF) components;
an antenna substrate coupled to the first ultra thin substrate, the antenna substrate including organic dielectric layers and a plurality of conductive layers for forming an antenna unit integrated within the antenna substrate, each of the plurality of conductive layers including a level of lateral interconnects, and the antenna unit for transmitting and receiving communications at a frequency of approximately 4 GHz or higher;
a first mold material to at least partially encapsulate the RF components that are integrated with the first ultra thin substrate, wherein the first mold material has an uppermost surface opposite the first ultra thin substrate, and wherein the uppermost surface of the first mold material is co-planar with an uppermost surface of one or more of the RF components of the first ultra thin substrate;
a second ultra thin substrate having radio frequency (RF) components; and
a second mold material to at least partially encapsulate the RF components that are integrated with the second ultra thin substrate, wherein the second mold material has an uppermost surface opposite the second ultra thin substrate, and wherein the uppermost surface of the second mold material is co-planar with an uppermost surface of one or more of the RF components of the second ultra thin substrate.

14. The microelectronic device of claim 13, wherein the first ultra thin substrate has a thickness of 50 to 80 microns.

15. The microelectronic device of claim 13, wherein the first mold material has a thickness of 50 to 150 microns.

16. The microelectronic device of claim 13, wherein the antenna substrate is disposed on a lower bottom surface of the first ultra thin substrate to form a three dimensional stacked package.

17. The microelectronic device of claim 13, wherein the antenna substrate is disposed on an upper surface of the first mold material of the first ultra thin substrate to form a three dimensional stacked package.

18. The microelectronic device of claim 13, further comprising:

an electromagnetic interference (EMI) shield integrated with the first ultra thin substrate or the antenna substrate to shield the RF components from EMI of the first ultra thin substrate.

19. A computing device comprising:
at least one processor to process data; and
a communication module or chip coupled to the at least one processor, the communication module or chip comprises,
a first ultra thin substrate formed of organic dielectric material and a plurality of conductive layers each including a level of lateral interconnects, wherein the first substrate includes an in-package first antenna unit integrated therein;
a first mold material to integrate first radio frequency (RF) components with the first substrate, wherein the first mold material has an uppermost surface opposite the first ultra thin substrate, and wherein the uppermost surface of the first mold material is co-planar with an uppermost surface of one or more of the first RF components;
a second ultra thin substrate being electrically coupled to the first ultra thin substrate, the second ultra thin substrate formed of organic dielectric material and a plurality of conductive layers each including a level of lateral interconnects, wherein the second substrate includes an in-package second antenna unit integrated therein; and
a second mold material to integrate second radio frequency (RF) components with the second substrate, wherein the second mold material has an uppermost surface opposite the second ultra thin substrate, and wherein the uppermost surface of the second mold material is co-planar with an uppermost surface of one or more of the second RF components.

20. The computing device of claim 19, wherein the first and second ultra thin substrates each have a thickness of 50 to 80 microns.

21. The computing device of claim 19, wherein the first substrate includes an in-package first wireless communication structure for communicating with an in-package second wireless communication structure of the second substrate.

22. The computing device of claim 19, wherein the first substrate the in-package first antenna unit for communicating with external devices and the second substrate includes the in-package second antenna unit for communicating with external devices.

23. The computing device of claim 19, wherein the first and second substrates each include conductive layers for forming contact lines for insertion into a card holder interface.

* * * * *